United States Patent
Jeong et al.

(10) Patent No.: US 7,719,033 B2
(45) Date of Patent: May 18, 2010

(54) SEMICONDUCTOR DEVICES HAVING THIN FILM TRANSISTORS AND METHODS OF FABRICATING THE SAME

(75) Inventors: Jae-Hun Jeong, Yongin-si (KR); Soon-Moon Jung, Sungnam-si (KR); Hoon Lim, Seoul (KR); Won-Seok Cho, Suwon-si (KR); Jin-Ho Kim, Hwasung-si (KR); Chang-Min Hong, Seoul (KR); Jong-Hyuk Kim, Suwon-si (KR); Kun-Ho Kwak, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 95 days.

(21) Appl. No.: 11/364,773

(22) Filed: Feb. 28, 2006

(65) Prior Publication Data
US 2006/0237725 A1    Oct. 26, 2006

(30) Foreign Application Priority Data
Apr. 20, 2005    (KR) .................... 10-2005-0032897

(51) Int. Cl.
*H01L 29/74* (2006.01)
(52) U.S. Cl. .................... 257/213; 257/70; 257/347; 257/409; 438/152; 438/405; 438/454
(58) Field of Classification Search .................. 257/213
See application file for complete search history.

(56) References Cited

U.S. PATENT DOCUMENTS 5,095,347 A * 3/1992 Kirsch .......................... 257/57
5,100,817 A * 3/1992 Cederbaum et al. .......... 438/152
5,185,280 A * 2/1993 Houston et al. .............. 438/163
5,233,211 A * 8/1993 Hayashi et al. .............. 257/347
5,308,778 A * 5/1994 Fitch et al. ................... 438/128
5,365,081 A * 11/1994 Yamazaki et al. .............. 257/67
5,366,911 A * 11/1994 Lur et al. ..................... 438/282
5,486,708 A * 1/1996 Takahashi et al. ............. 257/59
5,495,119 A * 2/1996 Ikeuchi ........................ 257/365
5,572,045 A * 11/1996 Takahashi et al. ............. 257/59
5,578,513 A * 11/1996 Maegawa ..................... 438/151
5,619,054 A * 4/1997 Hashimoto ................... 257/347
5,633,182 A * 5/1997 Miyawaki et al. ............. 438/30
5,675,185 A * 10/1997 Chen et al. ................... 257/774
5,712,494 A * 1/1998 Akiyama et al. .............. 257/59
5,780,930 A * 7/1998 Malladi et al. ................ 257/777

(Continued)

FOREIGN PATENT DOCUMENTS

JP            61-234027       10/1986

(Continued)

*Primary Examiner*—Fernando L Toledo
*Assistant Examiner*—Ankush K Singal
(74) *Attorney, Agent, or Firm*—Mills & Onello, LLP

(57) ABSTRACT

Semiconductor devices having thin film transistors (TFTs) and methods of fabricating the same are provided. The semiconductor devices include a semiconductor substrate and a lower interlayer insulating layer disposed on the semiconductor substrate. A lower semiconductor body disposed on or in the lower interlayer insulating layer. A lower TFT includes a lower source region and a lower drain region, which are disposed in the lower semiconductor body, and a lower gate electrode, which covers and crosses at least portions of at least two surfaces of the lower semiconductor body disposed between the lower source and drain regions.

15 Claims, 31 Drawing Sheets

U.S. PATENT DOCUMENTS

| | | | | |
|---|---|---|---|---|
| 5,811,324 A * | 9/1998 | Yang | | 438/159 |
| 5,818,069 A | 10/1998 | Kadosh et al. | | 257/67 |
| 5,883,399 A * | 3/1999 | Yin et al. | | 257/66 |
| 5,903,031 A * | 5/1999 | Yamada et al. | | 257/356 |
| 5,926,700 A * | 7/1999 | Gardner et al. | | 438/152 |
| 6,022,766 A * | 2/2000 | Chen et al. | | 438/152 |
| 6,034,433 A * | 3/2000 | Beatty | | 257/758 |
| 6,043,535 A * | 3/2000 | Houston | | 257/345 |
| 6,075,268 A * | 6/2000 | Gardner et al. | | 257/327 |
| 6,172,381 B1 * | 1/2001 | Gardner et al. | | 257/67 |
| 6,232,637 B1 * | 5/2001 | Gardner et al. | | 257/368 |
| 6,259,118 B1 * | 7/2001 | Kadosh et al. | | 257/67 |
| 6,297,145 B1 * | 10/2001 | Ito | | 438/619 |
| 6,358,828 B1 * | 3/2002 | Kadosh et al. | | 438/586 |
| 6,359,312 B1 * | 3/2002 | Komatsu | | 257/354 |
| 6,372,615 B2 * | 4/2002 | Back et al. | | 438/589 |
| 6,387,770 B2 * | 5/2002 | Roy | | 438/384 |
| 6,392,253 B1 * | 5/2002 | Saxena | | 257/59 |
| 6,417,533 B2 * | 7/2002 | Kawata et al. | | 257/296 |
| 6,429,484 B1 * | 8/2002 | Yu | | 257/347 |
| 6,504,229 B2 * | 1/2003 | Yamauchi et al. | | 257/532 |
| 6,580,132 B1 * | 6/2003 | Chan et al. | | 257/365 |
| 6,620,659 B2 * | 9/2003 | Emmma et al. | | 438/154 |
| 6,716,684 B1 | 4/2004 | Krivokapic et al. | | 438/157 |
| 6,781,238 B2 * | 8/2004 | Nonaka | | 257/773 |
| 6,943,067 B2 * | 9/2005 | Greenlaw | | 438/152 |
| 6,963,114 B2 * | 11/2005 | Lin | | 257/382 |
| 6,965,147 B2 * | 11/2005 | Shino | | 257/347 |
| 6,979,868 B2 * | 12/2005 | Chen et al. | | 257/356 |
| 7,247,528 B2 * | 7/2007 | Kwak et al. | | 438/149 |
| 7,250,680 B2 * | 7/2007 | Gonzalez | | 257/755 |
| 7,253,060 B2 * | 8/2007 | Yun et al. | | 438/284 |
| 7,276,421 B2 * | 10/2007 | Kim et al. | | 438/373 |
| 7,312,110 B2 * | 12/2007 | Kwak et al. | | 438/150 |
| 7,319,252 B2 * | 1/2008 | Chang | | 257/288 |
| 2001/0019144 A1 * | 9/2001 | Roy | | 257/296 |
| 2002/0028557 A1 * | 3/2002 | Lee et al. | | 438/300 |
| 2002/0158823 A1 * | 10/2002 | Zavracky et al. | | 345/87 |
| 2003/0016311 A1 * | 1/2003 | Sato et al. | | 349/43 |
| 2003/0122982 A1 * | 7/2003 | Shin et al. | | 349/43 |
| 2003/0189227 A1 * | 10/2003 | Liu et al. | | 257/347 |
| 2005/0151276 A1 * | 7/2005 | Jang et al. | | 257/903 |
| 2005/0179061 A1 * | 8/2005 | Jang et al. | | 257/208 |
| 2005/0184292 A1 * | 8/2005 | Kwak et al. | | 257/70 |
| 2005/0221544 A1 * | 10/2005 | Kwak et al. | | 438/150 |
| 2005/0248035 A1 * | 11/2005 | Son et al. | | 257/758 |
| 2006/0028861 A1 * | 2/2006 | Han et al. | | 365/154 |
| 2006/0068532 A1 * | 3/2006 | Schuele et al. | | 438/149 |
| 2006/0097319 A1 * | 5/2006 | Kim et al. | | 257/353 |
| 2006/0097328 A1 * | 5/2006 | Kim et al. | | 257/393 |
| 2006/0163571 A1 * | 7/2006 | Lim et al. | | 257/48 |
| 2006/0189126 A1 * | 8/2006 | Jang et al. | | 438/629 |
| 2006/0226485 A1 * | 10/2006 | Arakawa | | 257/347 |
| 2006/0275962 A1 * | 12/2006 | Lee | | 438/152 |
| 2007/0042554 A1 * | 2/2007 | Kim et al. | | 438/279 |
| 2007/0241334 A1 * | 10/2007 | Nagata | | 257/66 |

FOREIGN PATENT DOCUMENTS

| KR | 2001047794 | * 11/1999 |
|---|---|---|
| KR | 10-2004-0008426 | 1/2004 |

* cited by examiner

US 7,719,033 B2

SEMICONDUCTOR DEVICES HAVING THIN FILM TRANSISTORS AND METHODS OF FABRICATING THE SAME

This application claims the benefit of Korean Patent Application No. 10-2005-0032897, filed on Apr. 20, 2005, the contents of which are hereby incorporated herein by reference in their entirety.

BACKGROUND OF THE INVENTION

1. Field of the Invention

The present invention relates to semiconductor devices and methods of fabricating the same and, more particularly, to semiconductor devices having thin film transistors (TFTs) and methods of fabricating the same.

2. Description of Related Art

In general, semiconductor integrated circuits (ICs) widely employ discrete devices such as MOS transistors as switching devices. Most of the MOS transistors are directly formed on a semiconductor substrate. That is, the MOS transistors include channel regions and source and drain regions, which are formed in the semiconductor substrate. In this case, the MOS transistors may be referred to as bulk MOS transistors.

When the semiconductor ICs employ the bulk MOS transistors, increasing the integration density of the semiconductor ICs is reaching a technical limit. In particular, if the semiconductor ICs employ complementary metal-oxide-semiconductor (CMOS) circuits, it is more difficult to improve the integration density thereof. This is because a latch-up phenomenon occurs in the CMOS circuits. In recent years, thin film transistors (TFTs), which are stacked on the semiconductor substrate, are widely used to increase the integration density of the semiconductor ICs and also overcome the latch-up phenomenon.

FIG. 1A is a plan view of a conventional semiconductor device having a TFT, FIG. 1B is a cross-sectional view taken along line I-I' of FIG. 1A, and FIG. 1C is a cross-sectional view taken along line II-II' of FIG. 1A.

Referring to FIGS. 1A, 1B and 1C, an isolation layer 10 is provided in a predetermined region of a semiconductor substrate 5 to define an active region 10a. A pair of first impurity regions, i.e., a first drain region 20d and a first source region 20s, are disposed in the active region 10a and spaced apart from each other. A bulk gate electrode 15 is disposed to cross over a channel region that is disposed between the first drain region 20d and the first source region 20s. The bulk gate electrode 15 is electrically insulated from the channel region by a bulk gate insulating layer 12. Sidewalls of the bulk gate electrode 15 may be covered with a bulk gate spacer 17. The bulk gate electrode 15, the first drain region 20d, and the first source region 20s constitute a bulk MOS transistor.

A first interlayer insulating layer 22 is provided on the semiconductor substrate 5 having the bulk MOS transistor. A trench 27t is disposed in the first interlayer insulating layer 22. The trench 27t may overlap the active region 10a. A lower semiconductor body 30 is filled in the trench 27t. A pair of second impurity regions, i.e., a lower drain region 30d and a lower source region 30s, are disposed in the lower semiconductor body 30 and spaced apart from each other. A lower gate electrode 35 is disposed to cross over a channel region that is disposed between the lower drain region 30d and the lower source region 30s. The lower gate electrode 35 is electrically insulated from the channel region by a lower gate insulating layer 32. Sidewalls of the lower gate electrode 35 may be covered with a lower gate spacer 37. The lower gate electrode 35, the lower drain region 30d, and the lower source region 30s constitute a lower TFT. Also, as can be seen from FIG. 1A, the lower TFT may overlap the bulk MOS transistor. That is, the lower semiconductor body 30 may overlap the active region 10a, and the lower gate electrode 35 may overlap the bulk gate electrode 15.

Furthermore, the first drain region 20d may be exposed by a lower node contact hole 25h that is formed through the first interlayer insulating layer 22, and the lower node contact hole 25h may be filled with a lower semiconductor node plug 25. The lower semiconductor node plug 25 may be in contact with a bottom surface of the lower semiconductor body 30. For example, the lower semiconductor node plug 25 may be in contact with the lower drain region 30d. The lower semiconductor node plug 25 may be a semiconductor plug that is formed by a selective epitaxial growth (SEG) process using the first drain region 20d as a seed layer. Accordingly, when the semiconductor substrate 5 is a single crystalline semiconductor substrate, the lower semiconductor node plug 25 may also have a single crystalline structure.

Also, the lower semiconductor body 30 may be epitaxially grown using the lower semiconductor node plug 25 as a seed layer. Accordingly, when the lower semiconductor node plug 25 is a single crystalline semiconductor plug, the lower semiconductor body 30 may also have a single crystalline structure.

A second interlayer insulating layer 40 is provided on the semiconductor substrate 5 having the lower TFT. When the lower semiconductor node plug 25 has the same conductivity type as the first drain region 20d, at least the lower drain region 30 may be exposed by a metal node contact hole 42h that is formed through the first and second interlayer insulating layers 22 and 40, and the metal node contact hole 42h may be filled with a metal node plug 42. As a result, the metal node plug 42 is in contact with at least the lower drain region 30d. When the lower semiconductor node plug 25 has a different conductivity type from the first drain region 20d, the metal node plug 42 may extend and come into contact with the first drain region 20d. Further, the metal node plug 42 may be in contact with not only the drain regions 30d and 20d but also the lower semiconductor node plug 25.

A third interlayer insulating layer 45 is provided on the semiconductor substrate 5 having the second interlayer insulating layer 40 and the metal node plug 42. The metal node plug 42 may be exposed by a first lower interconnection contact hole 46a that is formed through the third interlayer insulating layer 45, and the lower source region 30s may be exposed by a second lower interconnection contact hole 46b that is formed through the second and third interlayer insulating layers 40 and 45. Also, the first source region 20s may be exposed by a third lower interconnection contact hole 46c that is formed through the first through third interlayer insulating layers 22, 40, and 45, and the lower gate electrode 35 may be exposed by a fourth lower interconnection contact hole 46d that is formed through the second and third interlayer insulating layers 40 and 45. Further, the bulk gate electrode 15 may be exposed by a fifth lower interconnection contact hole 46e that is formed through the first through third interlayer insulating layers 22, 40, and 45. The first through fifth lower interconnection contact holes 46a, 46b, 46c, 46d, and 46e may be filled with first through fifth lower interconnection contact plugs 47a, 47b, 47c, 47d, and 47e, respectively.

As can be seen from FIGS. 1B and 1C, when the semiconductor device includes a multi-layered transistor, the contact plugs 47a, 47b, 47c, 47d, and 47e are provided to apply a voltage to the bulk MOS transistor and the lower TFT. In this case, since the lower TFT is disposed over the bulk MOS transistor, the third and fifth lower interconnection contact plugs 47c and 47e and the bulk gate electrode 15, which are used to apply a voltage to the bulk MOS transistor, are disposed close to lateral and bottom surfaces of the lower TFT. Accordingly, as the body energy potential of the lower semiconductor body 30 varies with surrounding voltage conditions, the characteristics of the lower TFT may change. That is, the characteristics of the lower TFT depend on gate, source, and drain voltages of the lower TFT, like a bulk transistor or a silicon on insulator (SOI) transistor, and also are affected by circumstances (e.g., energy potential) around the lower TFT. For example, even if a voltage of 0 V is applied to the lower gate electrode 35 to turn off the lower TFT, once a voltage Vcc is applied to the bulk gate electrode 15 through the fifth lower interconnection contact plug 47e, an upper region of the lower semiconductor body 30 of the lower TFT remains turned off under the influence of the lower gate electrode 35, whereas lower and lateral regions of the lower semiconductor body 30 are more affected by the bulk gate electrode 15 and contact voltages as can be seen from reference characters 'A1' and 'B1', respectively, thus greatly increasing an off current of the lower TFT.

Therefore, it is necessary to develop semiconductor devices having TFTs in which a lower semiconductor body is not significantly affected by the surrounding energy potential.

SUMMARY OF THE INVENTION

Embodiments of the invention provide semiconductor devices having thin film transistors (TFTs) in which a semiconductor body is less affected by the surrounding energy potential or electrically insulated from the surrounding energy potential, and methods of fabricating the same.

In one aspect, the invention is directed to a semiconductor device having a TFT. The semiconductor device includes a semiconductor substrate and a lower interlayer insulating layer disposed on the semiconductor substrate. A lower semiconductor body is disposed on or in the lower interlayer insulating layer. A lower TFT includes a lower source region and a lower drain region, which are disposed in the lower semiconductor body, and a lower gate electrode, which covers and crosses at least portions of at least two surfaces of the lower semiconductor body, disposed between the lower source and drain regions.

In some embodiments of the present invention, the lower gate electrode may cover and cross a top portion, a bottom portion, and sidewalls of the lower semiconductor body disposed between the lower source and drain regions.

In other embodiments, the lower gate electrode may cover and cross a top portion and sidewalls of the lower semiconductor body disposed between the lower source and drain regions.

In yet other embodiments, the lower gate electrode may cover and cross top and bottom portions of the lower semiconductor body disposed between the lower source and drain regions.

In yet other embodiments, the lower gate electrode may cover and cross a bottom portion and sidewalls of the semiconductor body disposed between the lower source and drain regions.

In yet other embodiments, the semiconductor device may further include a bulk MOS transistor including a bulk source region and a bulk drain region, which are disposed in the semiconductor substrate between the semiconductor substrate and the lower interlayer insulating layer, and a bulk gate electrode, which is disposed to cross over a channel region disposed between the bulk source and drain regions. In this case, at least a portion of the bulk MOS transistor may overlap the lower TFT. Also, a floating conductive layer pattern may be further disposed in the lower interlayer insulating layer between the bulk MOS transistor and the lower TFT in a horizontal direction.

In yet other embodiments, the semiconductor device may further include an upper interlayer insulating layer disposed on the semiconductor substrate having the lower TFT. An upper semiconductor body may be disposed on or in the upper interlayer insulating layer. Also, an upper TFT may be included. The upper TFT may include an upper source region and an upper drain region, which are disposed in the upper semiconductor body, and an upper gate electrode, which crosses the upper semiconductor body between the upper source and drain regions. The upper gate electrode may cover and cross at least portions of at least two surfaces of the upper semiconductor body disposed between the upper source and drain regions.

In another aspect, the present invention is directed to a method of fabricating a semiconductor device having a TFT. The method includes forming a lower interlayer insulating layer on a semiconductor substrate. A lower semiconductor body is formed on or in the lower interlayer insulating layer. A lower TFT is formed. The lower TFT includes a lower source region and a lower drain region, which are formed in the lower semiconductor body, and a lower gate electrode, which is formed to cover and cross at least portions of at least two surfaces of the lower semiconductor body disposed between the lower source and drain regions.

In some embodiments of the present invention, the lower gate electrode may be formed to cover and cross a top portion, a bottom portion, and sidewalls of the lower semiconductor body between the lower source and drain regions. In this case, the formation of the lower semiconductor body and the lower TFT may include forming a trench in the lower interlayer insulating layer, and forming a lower semiconductor body in the trench. Thereafter, a second lower interlayer insulating layer may be formed on the semiconductor substrate having the lower semiconductor body. Portions of the second lower interlayer insulating layer and the lower interlayer insulating layer may be sequentially etched to expose a top portion, sidewalls, and a bottom portion of a predetermined region of the lower semiconductor body. A lower gate electrode may be formed to cover the exposed top portion, sidewalls, and bottom portion of the lower semiconductor body and to cross the lower semiconductor body. Impurity ions may be implanted into the lower semiconductor body using the lower gate electrode as an ion implantation mask, thereby forming lower source and drain regions.

In other embodiments, the lower gate electrode may be formed to cover and cross a top portion and sidewalls of the lower semiconductor body disposed between the lower source and drain regions. In this case, the formation of the lower semiconductor body and the lower TFT may include forming a trench in the lower interlayer insulating layer. Thereafter, a lower semiconductor body may be formed in the trench. The lower interlayer insulating layer may be etched back to expose at least portions of the sidewalls the lower semiconductor body. A lower gate electrode may be formed to cover and cross the exposed top portion and sidewalls of a predetermined region of the lower semiconductor body. Impurity ions may be implanted into the lower semiconductor body using the lower gate electrode as an ion implantation mask, thereby forming lower source and drain regions.

In yet other embodiments, the lower gate electrode may be formed to cover and cross top and bottom portions of the lower semiconductor body disposed between the lower source and drain regions. In this case, the formation of the lower semiconductor body and the lower TFT may include forming a first lower gate electrode on the lower interlayer insulating layer. A second lower interlayer insulating layer may be formed to cover the first lower gate electrode. A trench may be formed to a larger area in the second lower interlayer insulating layer to expose a top surface of the first lower gate electrode. A lower semiconductor body may be formed in the trench. A second lower gate electrode may be formed across the lower semiconductor body on the semiconductor substrate having the lower semiconductor body. In this case, the first and second lower gate electrodes constitute the lower gate electrode. Impurity ions may be implanted into the lower semiconductor body using the second lower gate electrode as an ion implantation mask, thereby forming lower source and drain regions.

In yet other embodiments, the lower gate electrode may be formed to cover and cross a bottom portion and sidewall of the lower semiconductor body disposed between the lower source and drain regions.

The method may further include forming a gate insulating layer between the lower semiconductor body and the lower gate electrode.

Also, the method may further include forming a bulk MOS transistor including a bulk source region and a bulk drain region, which are disposed in the semiconductor substrate between the semiconductor substrate and the lower interlayer insulating layer, and a bulk gate electrode, which is disposed to cross over a channel region disposed between the bulk source and drain regions. In this case, at least a portion of the bulk MOS transistor may overlap the lower TFT. A floating conductive layer pattern may be further formed in the lower interlayer insulating layer between the bulk MOS transistor and the lower TFT in a horizontal direction.

The method may further include forming an upper interlayer insulating layer on the semiconductor substrate having the lower TFT. An upper semiconductor body may be on or in the upper interlayer insulating layer. An upper TFT may be formed. The upper TFT may include an upper source region and an upper drain region, which are formed in the upper semiconductor body, and an upper gate electrode, which is formed across the upper semiconductor body between the upper source and drain regions. The upper gate electrode may be formed to cover and cross at least portions of at least two surfaces of the upper semiconductor body disposed between the upper source and drain regions.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

FIGS. 2A, 3A, 4A, 5A, 6A, 7A, and 8A are plan views illustrating a method of fabricating a semiconductor device having a thin film transistor (TFT) according to an exemplary embodiment of the present invention, FIGS. 2B, 3B, 4B, 5B, 6B, 7B, and 8B are cross-sectional views taken along lines I-I' of FIGS. 2A, 3A, 4A, 5A, 6A, 7A, and 8A respectively, and FIGS. 2C, 3C, 4C, 5C, 6C, 7C, and 8C are cross-sectional views taken along lines II-II' of FIGS. 2A, 3A, 4A, 5A, 6A, 7A, and 8A, respectively.

Figure 1A:
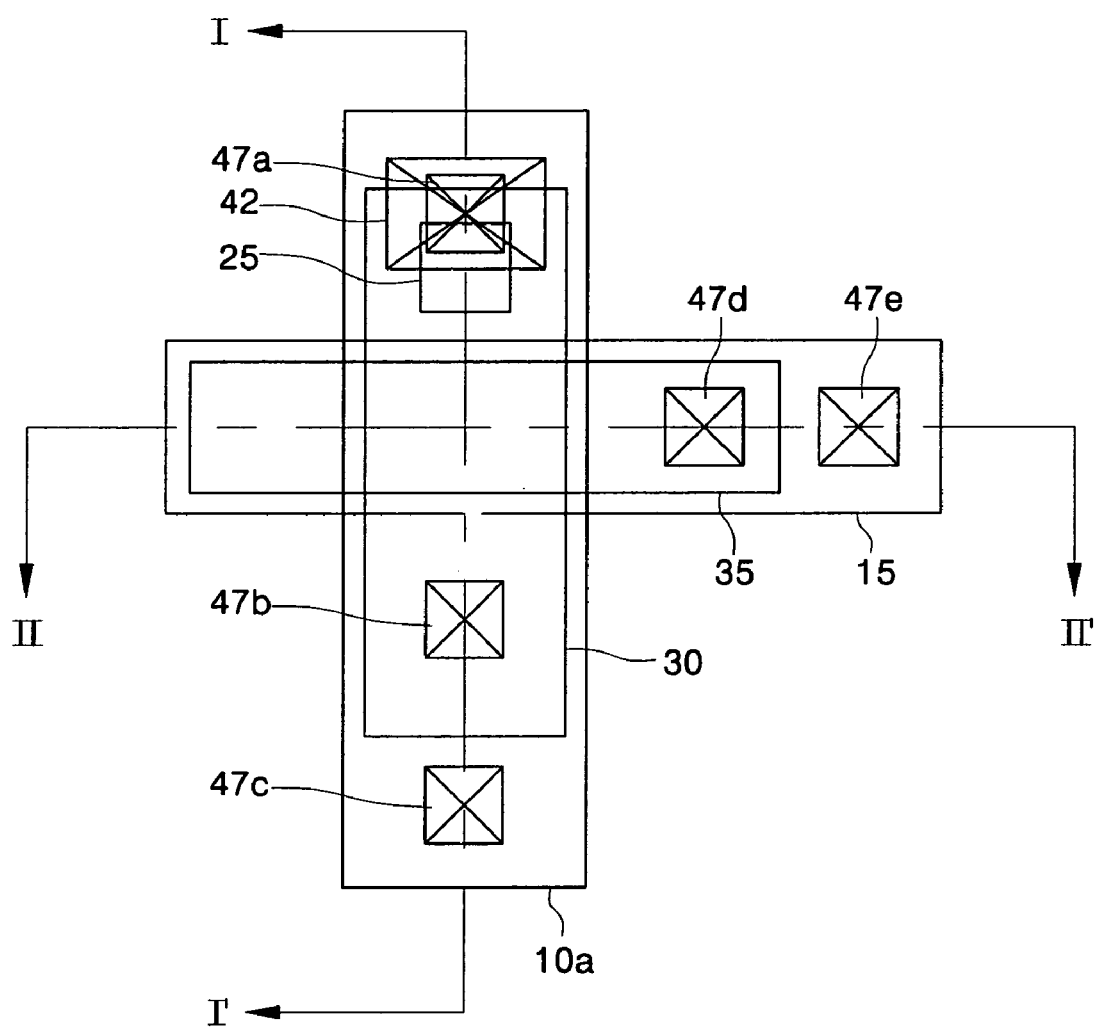
FIG. 1A is a plan view of a conventional semiconductor device having a thin film transistor (TFT).
Figure 1B:
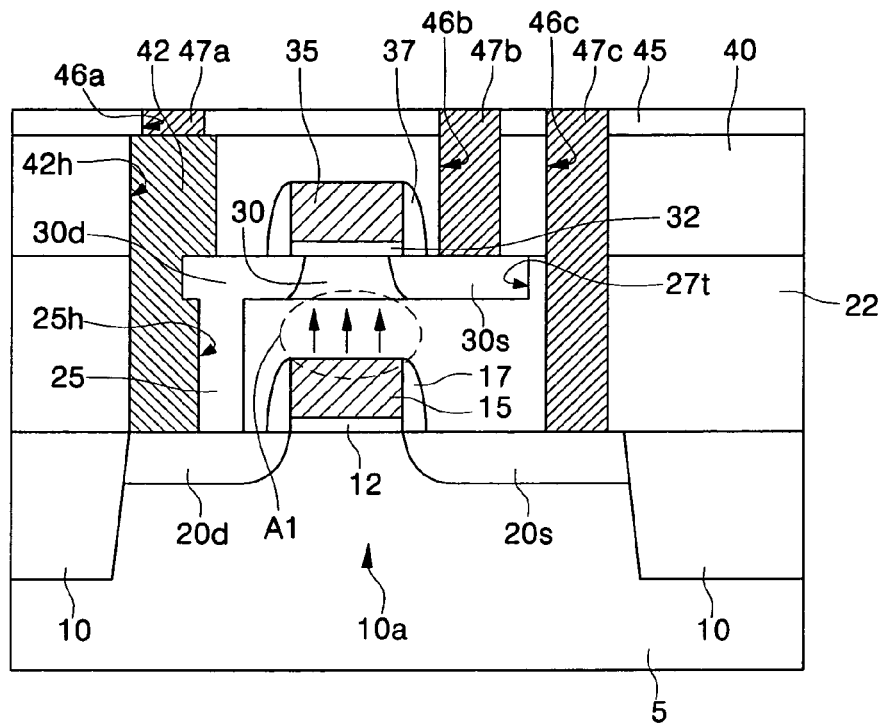
FIG. 1B is a cross-sectional view taken along line I-I' of FIG. 1A.
Figure 1C:
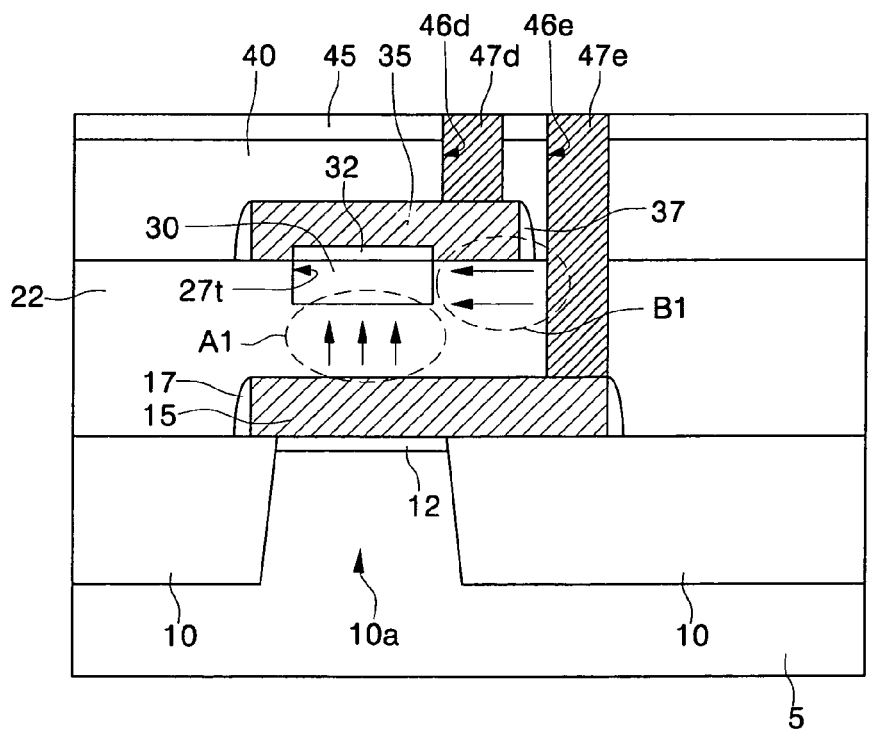
FIG. 1C is a cross-sectional view taken along line II-II' of FIG. 1A.
Figure 2A:
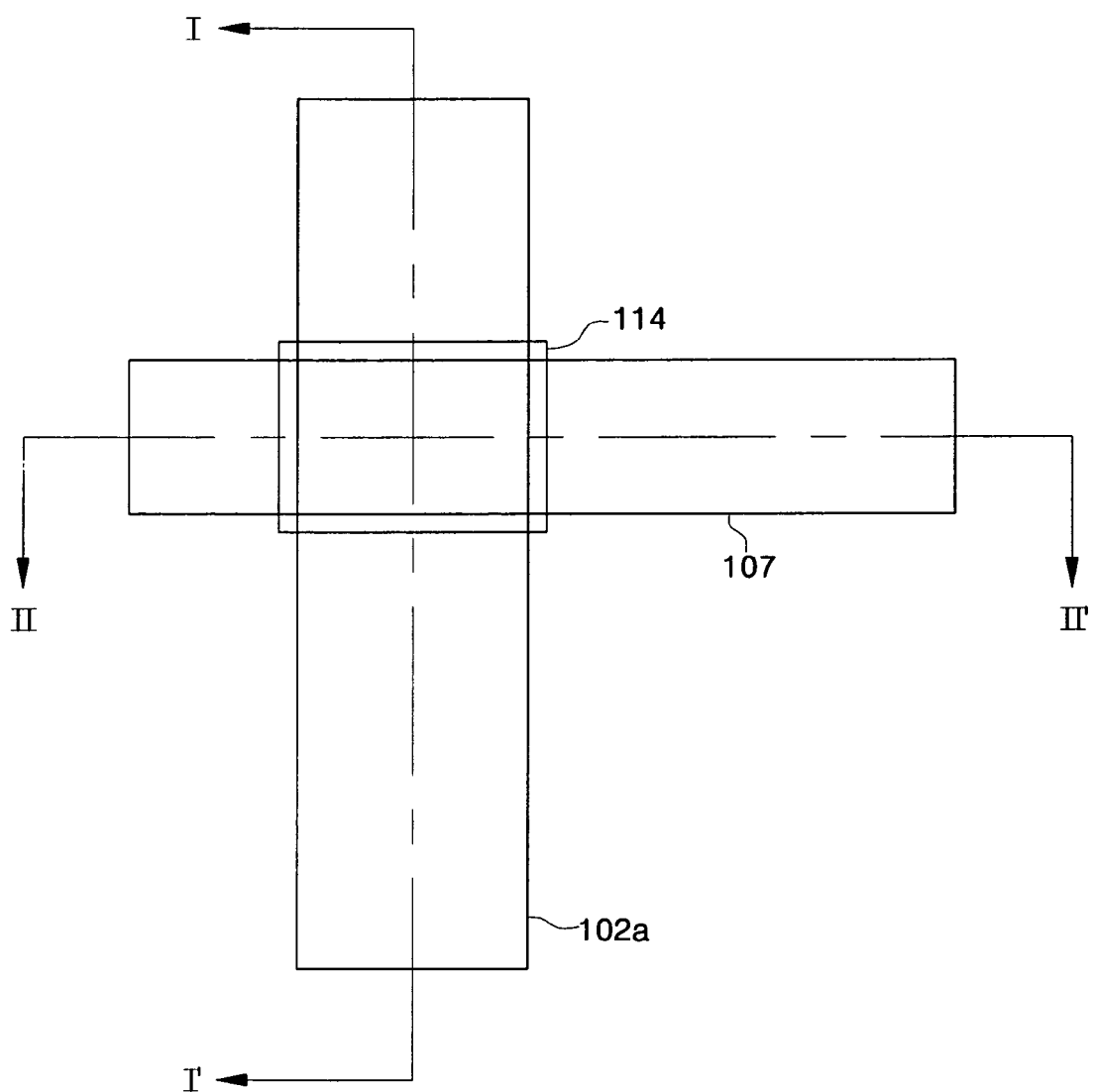
FIGS. 2A, 3A, 4A, 5A, 6A, 7A, and 8A are plan views illustrating a method of fabricating a semiconductor device having a TFT according to an exemplary embodiment of the present invention.
Figure 2B:
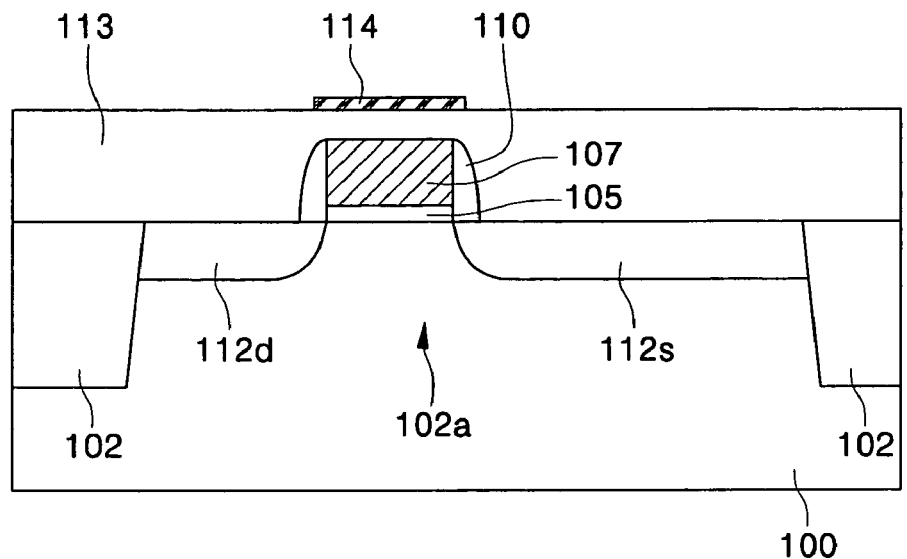
FIGS. 2B, 3B, 4B, 5B, 6B, 7B, and 8B are cross-sectional views taken along lines I-I' of FIGS. 2A, 3A, 4A, 5A, 6A, 7A, and 8A, respectively.
Figure 2C:
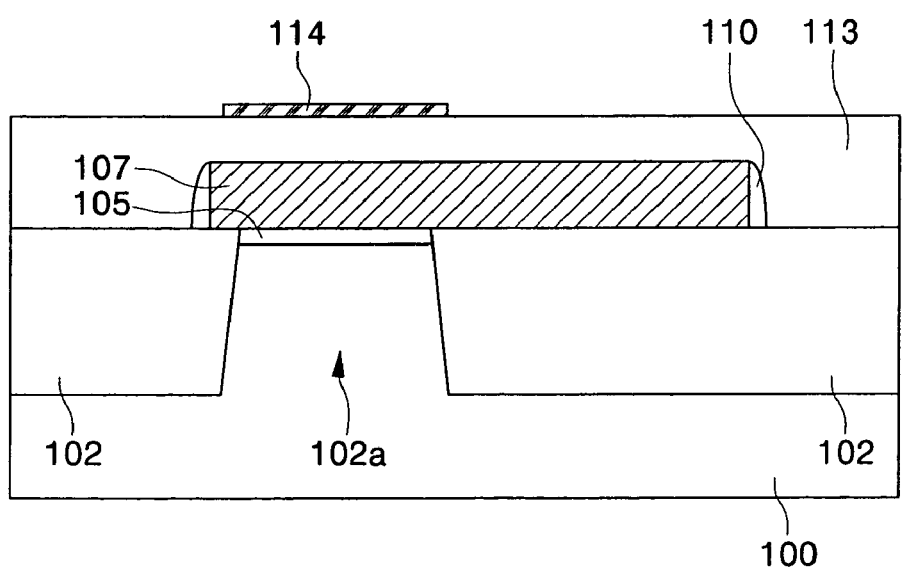
FIGS. 2C, 3C, 4C, 5C, 6C, 7C, and 8C are cross-sectional views taken along lines II-II' of FIGS. 2A, 3A, 4A, 5A, 6A, 7A, and 8A, respectively.

Referring to FIGS. 2A, 2B and 2C, an isolation layer 102 is provided in a predetermined region of a semiconductor substrate 100 to define an active region 102a. A bulk gate electrode 107 is formed across the active region 102a on the semiconductor substrate 100 having the active region 102a. Before the bulk gate electrode 107 is formed, a bulk gate insulating layer 105 may be formed between the bulk gate electrode 107 and the active region 102a. A bulk gate spacer 110 may be formed to cover sidewalls of the bulk gate electrode 107 and the bulk gate insulating layer 105 at the same time. Impurity ions are implanted into the semiconductor substrate 100 using the bulk gate electrode 107 and the bulk gate spacer 110 as ion implantation masks, thereby forming a bulk source region 112s and a bulk drain region 112d in the active region 102a. The bulk gate electrode 107, the bulk source region 112s, and the bulk drain region 112d constitute a bulk MOS transistor.

A planarized first lower interlayer insulating layer 113 is formed on the semiconductor substrate 100 having the bulk MOS transistor. A floating conductive layer pattern 114 may be formed on the first lower interlayer insulating layer 113. The floating conductive layer pattern 114 may overlap the bulk gate electrode 107. The floating conductive layer pattern 114 may be formed of a heavily doped silicon layer or a metal layer.

Figure 3A:
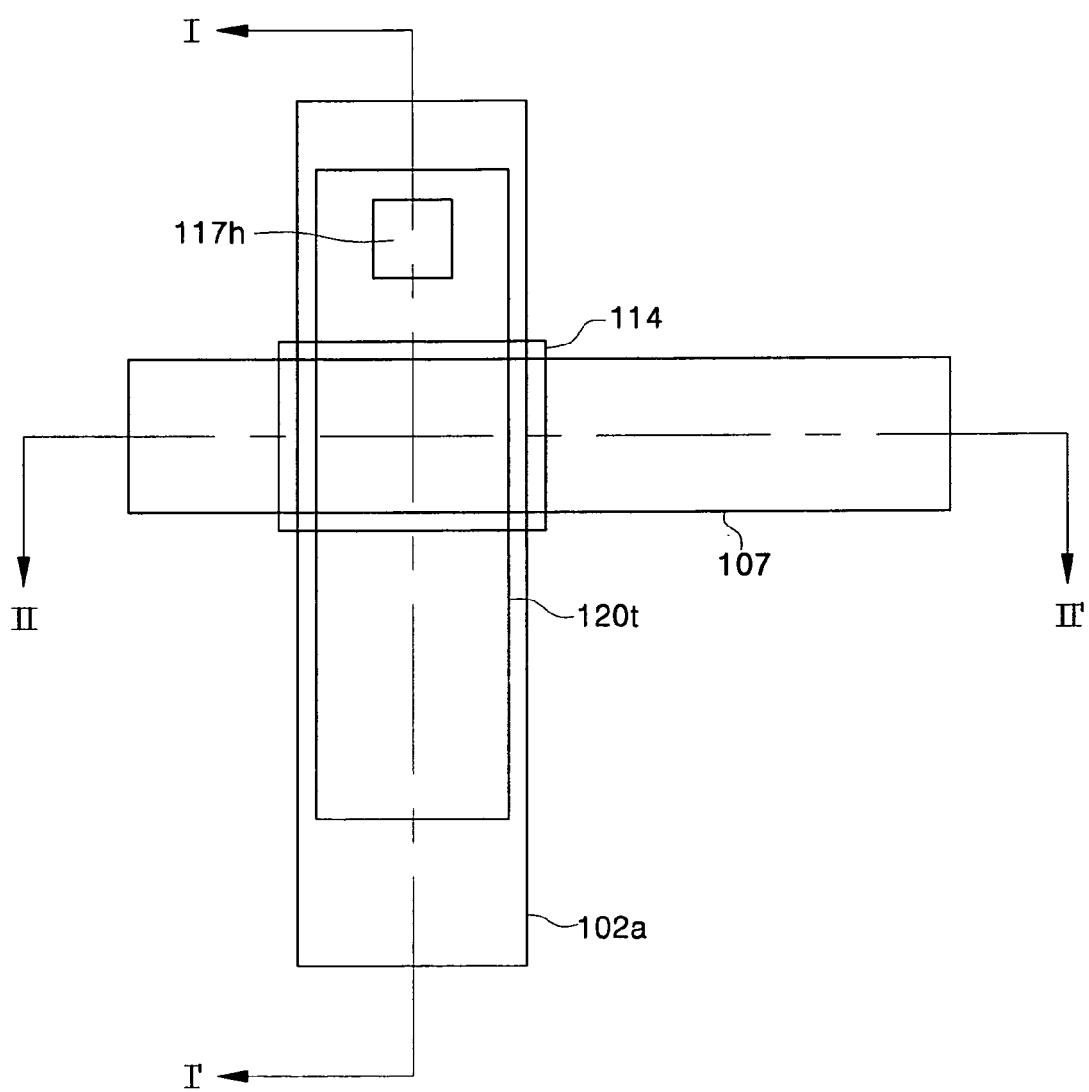
Figure 3B:
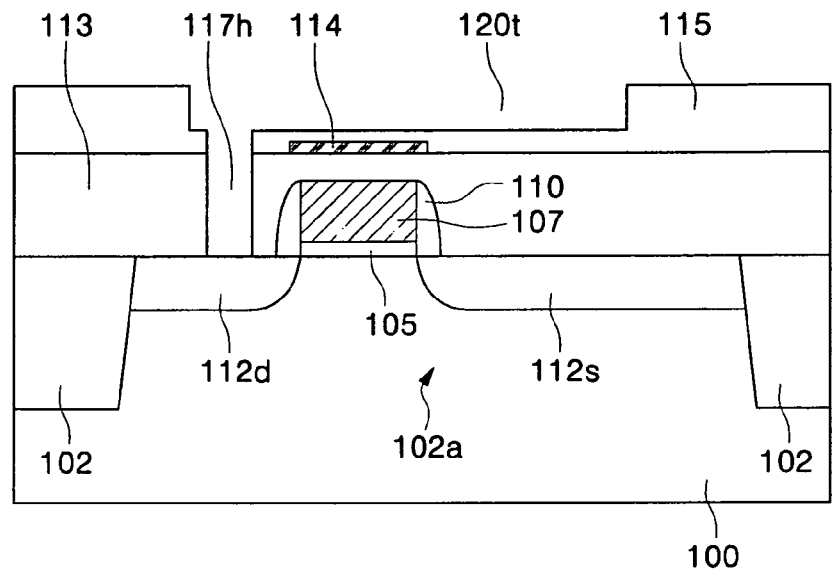
Figure 3C:
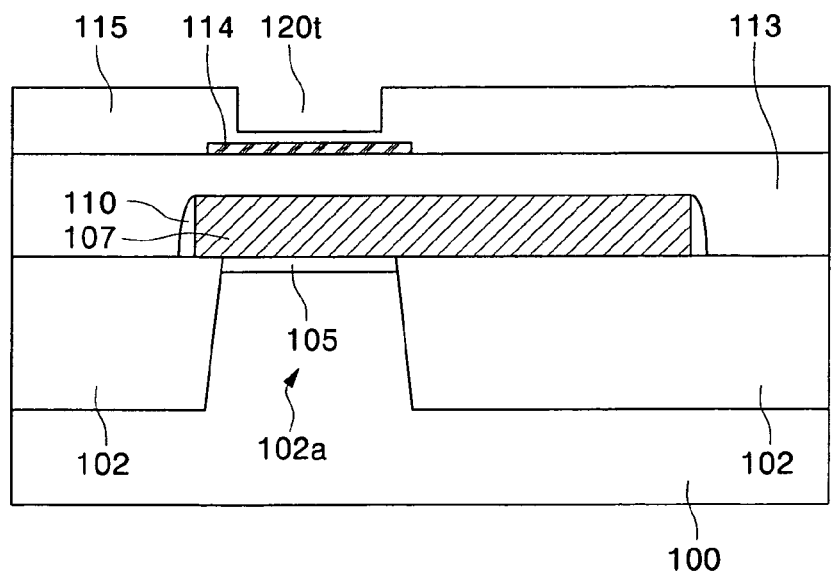

Referring to FIGS. 3A, 3B and 3C, a second lower interlayer insulating layer 115 is formed on the semiconductor substrate 100 having the floating conductive layer pattern 114. The second and first lower interlayer insulating layers 115 and 113 may be sequentially patterned, thereby forming a lower node contact hole 117h that exposes the bulk drain region 112d. Thereafter, a trench 120t may be formed in the second lower interlayer insulating layer 115 over the active region 102a. In this case, the trench 120t is formed such that it includes the lower node contact hole 117h. Alternatively, after the trench 120t is first formed, the lower node contact hole 117h may be formed.

Figure 4A:
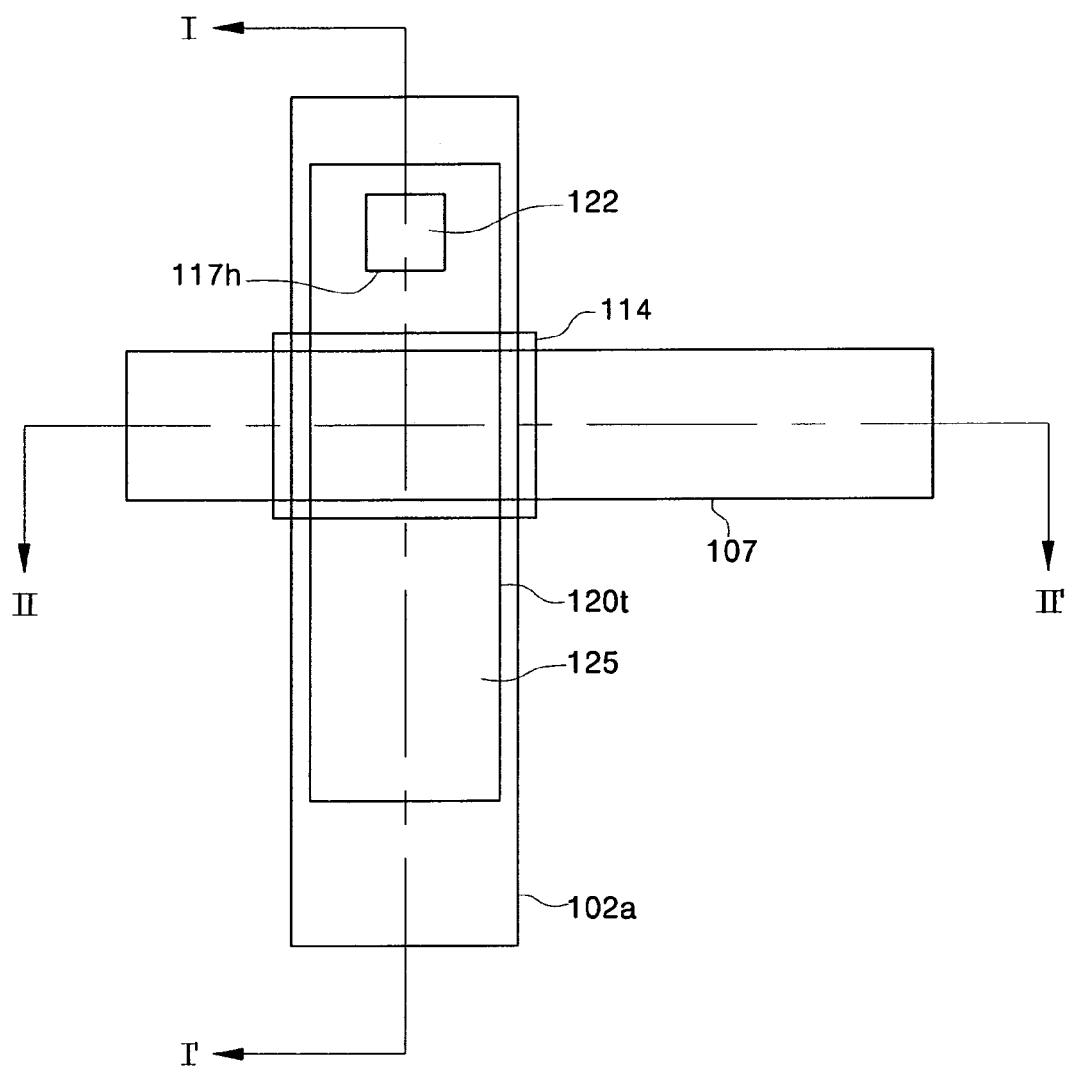
Figure 4B:
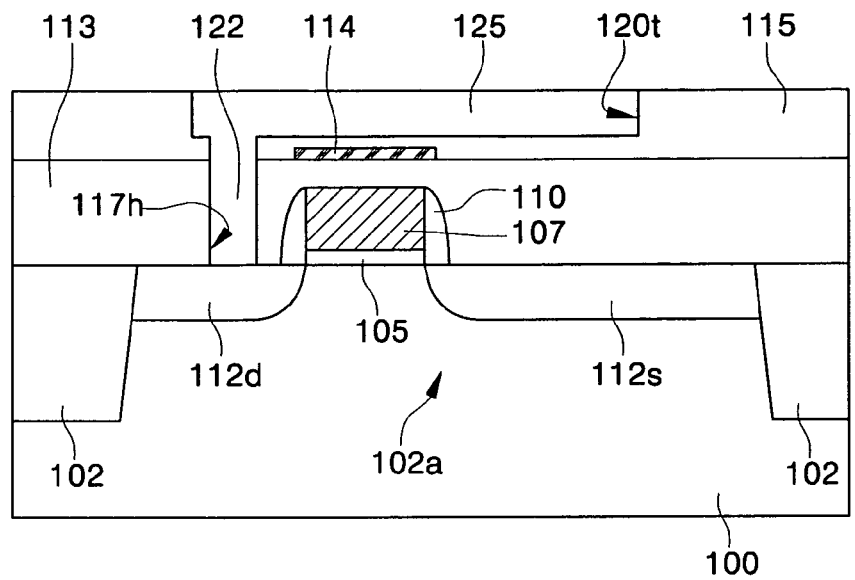
Figure 4C:
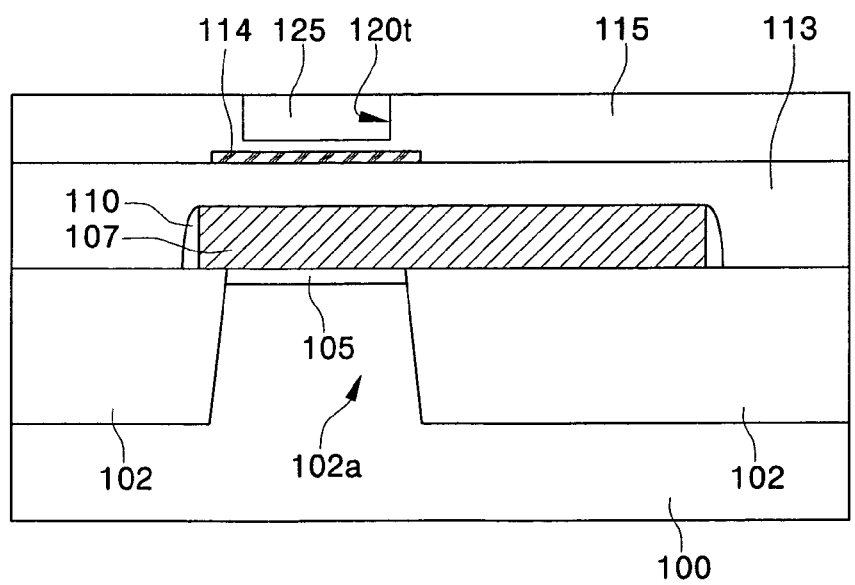

Referring to FIGS. 4A, 4B and 4C, a conductive layer may be filled in the lower node contact hole 117h, thereby forming a lower semiconductor node plug 122. The lower semiconductor node plug 122 may be formed by a selective epitaxial growth (SEG) process using the bulk drain region 112d as a seed layer. Accordingly, when the semiconductor substrate 100 is a single crystalline semiconductor substrate, the lower semiconductor node plug 122 may also have a single crystalline structure. Also, a lower semiconductor body 125 may be filled in the trench 120t by a SEG process using the lower semiconductor node plug 122 as a seed layer. Accordingly, when the lower semiconductor node plug 122 is a single crystalline semiconductor plug, the lower semiconductor body 125 may also have a single crystalline structure.

Figure 5A:
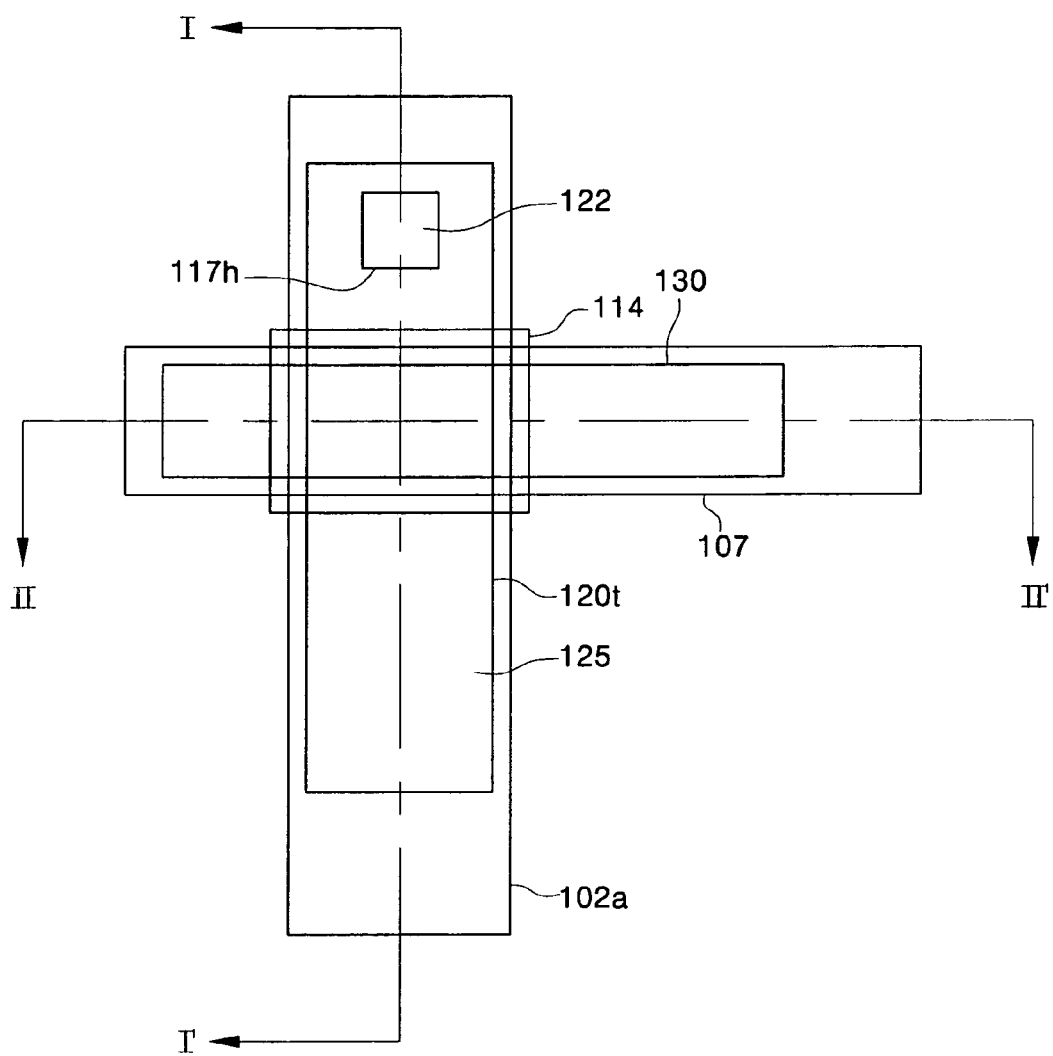
Figure 5B:
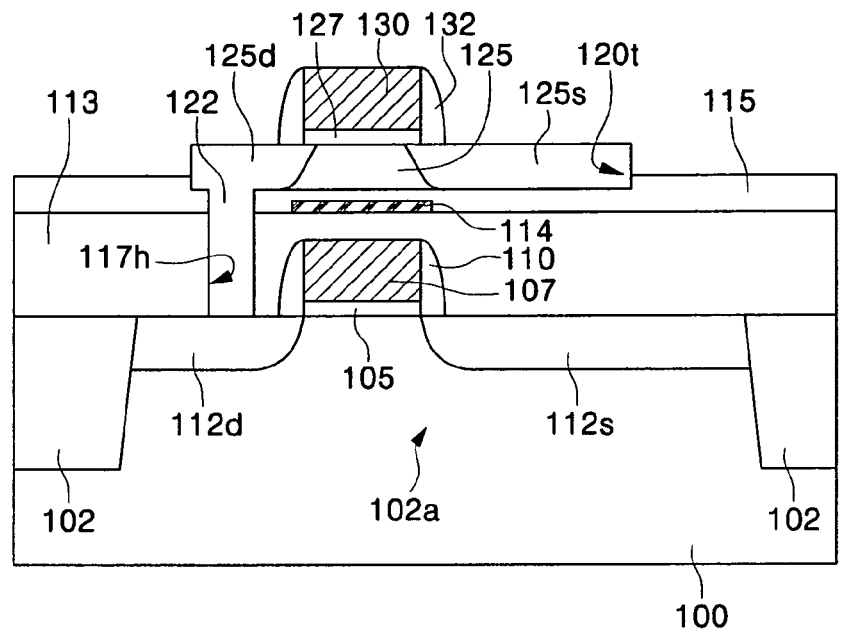
Figure 5C:
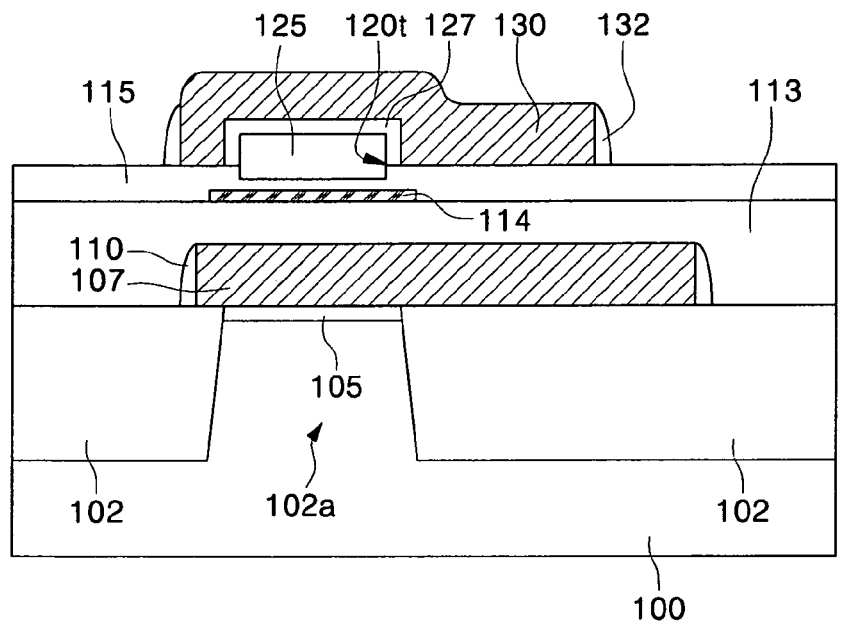

Referring to FIGS. 5A, 5B and 5C, the second lower interlayer insulating layer 115 may be etched back to expose at least portions of sidewalls of the lower semiconductor body 125. Subsequently, a lower gate electrode 130 is formed to cover and cross the exposed sidewalls and a top portion of a predetermined region of the lower semiconductor body 125. Before the lower gate electrode 130 is formed, a lower gate insulating layer 127 may be formed between the lower gate electrode 130 and the lower semiconductor body 125. A lower gate spacer 132 may be formed to cover sidewalls of the lower gate electrode 130 and the lower gate insulating layer 127 at the same time. Thereafter, impurity ions are implanted into the lower semiconductor body 125 using the lower gate electrode 130 and the lower gate spacer 132 as ion implantation masks, thereby forming a lower source region 125s and a lower drain region 125d. The lower source region 125s, the lower drain region 125d, and the lower gate electrode 130 constitute a lower TFT. As can be seen from FIG. 5A, the lower TFT may overlap the bulk MOS transistor. That is, the lower semiconductor body 125 may overlap the active region 102a, and the lower gate electrode 130 may overlap the bulk gate electrode 107.

Figure 6A:
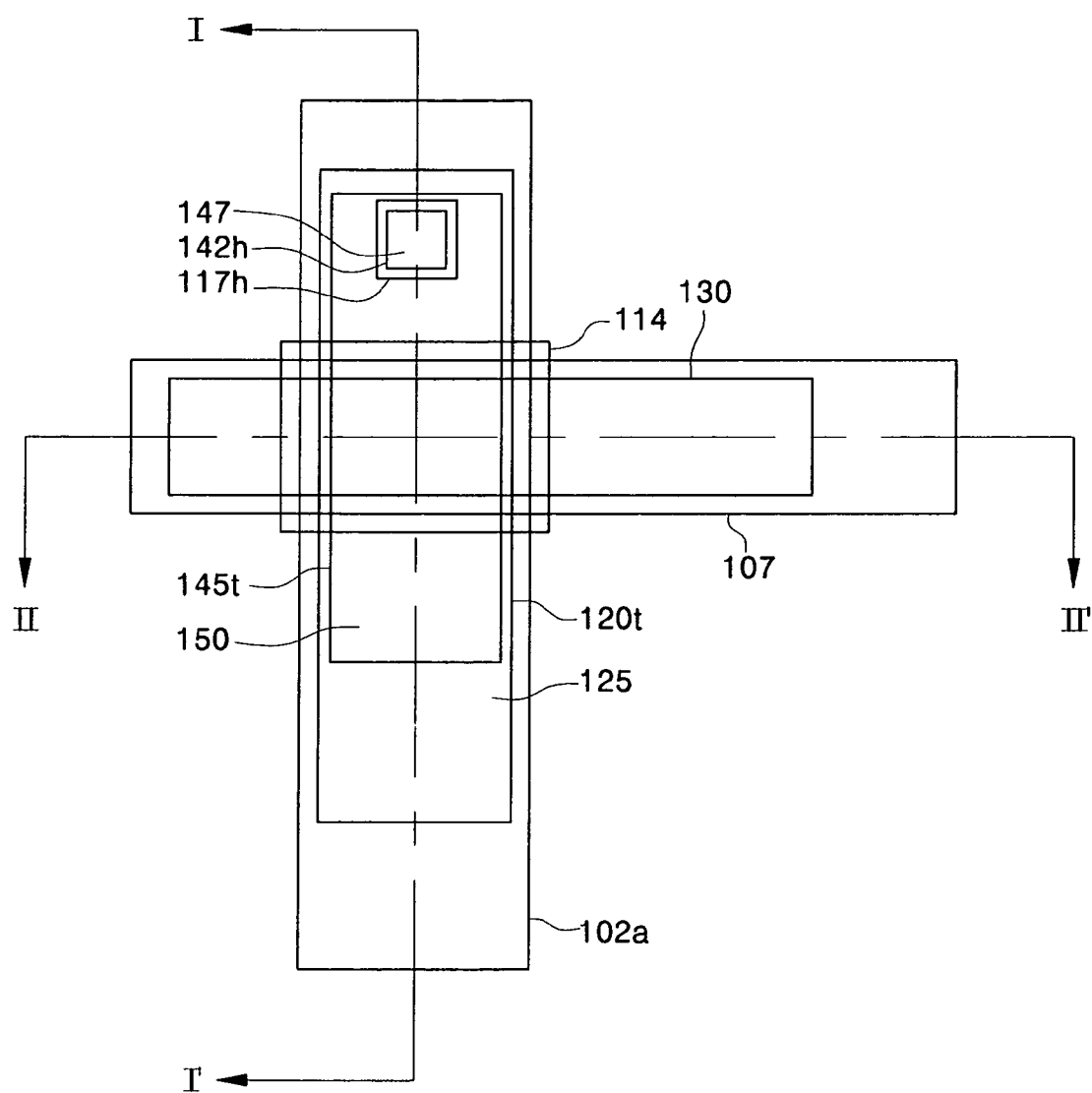
Figure 6B:
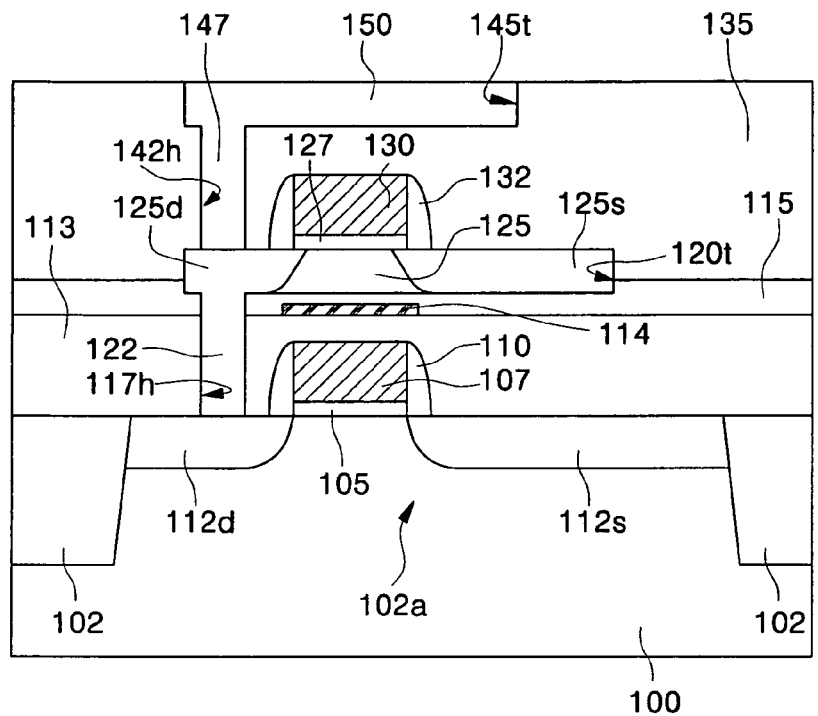
Figure 6C:
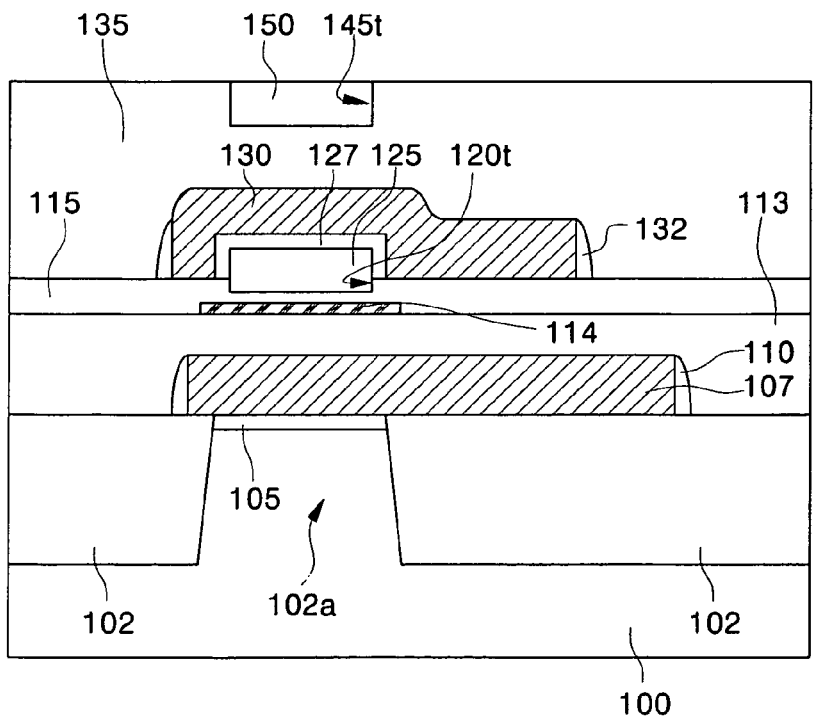

Referring to FIGS. 6A, 6B and 6C, a planarized upper interlayer insulating layer 135 may be formed on the semiconductor substrate 100 having the lower TFT. The upper interlayer insulating layer 135 may be patterned to form an upper node contact hole 142h that exposes the lower drain region 125d. Thereafter, an upper trench 145t is formed in the upper interlayer insulating layer 135 such that it includes the upper node contact hole 142h. The upper trench 145t may overlap the lower semiconductor body 125. Alternatively, after the upper trench 145t is first formed, the upper node contact hole 142h may be formed. A conductive layer may be filled in the upper node contact hole 142h, thereby forming an upper semiconductor node plug 147. The upper semiconductor node plug 147 may be formed by a SEG process using the lower drain region 125d as a seed layer. Accordingly, when the lower semiconductor body 125 is a single crystalline semiconductor body, the upper semiconductor node plug 147 may also have a single crystalline structure. An upper semiconductor body 150 may be filled in the upper trench 145t by a SEG process using the upper semiconductor node plug 147 as a seed layer. Accordingly, when the upper semiconductor node plug 147 is a single crystalline semiconductor plug, the upper semiconductor body 150 may also have a single crystalline structure.

Figure 7A:
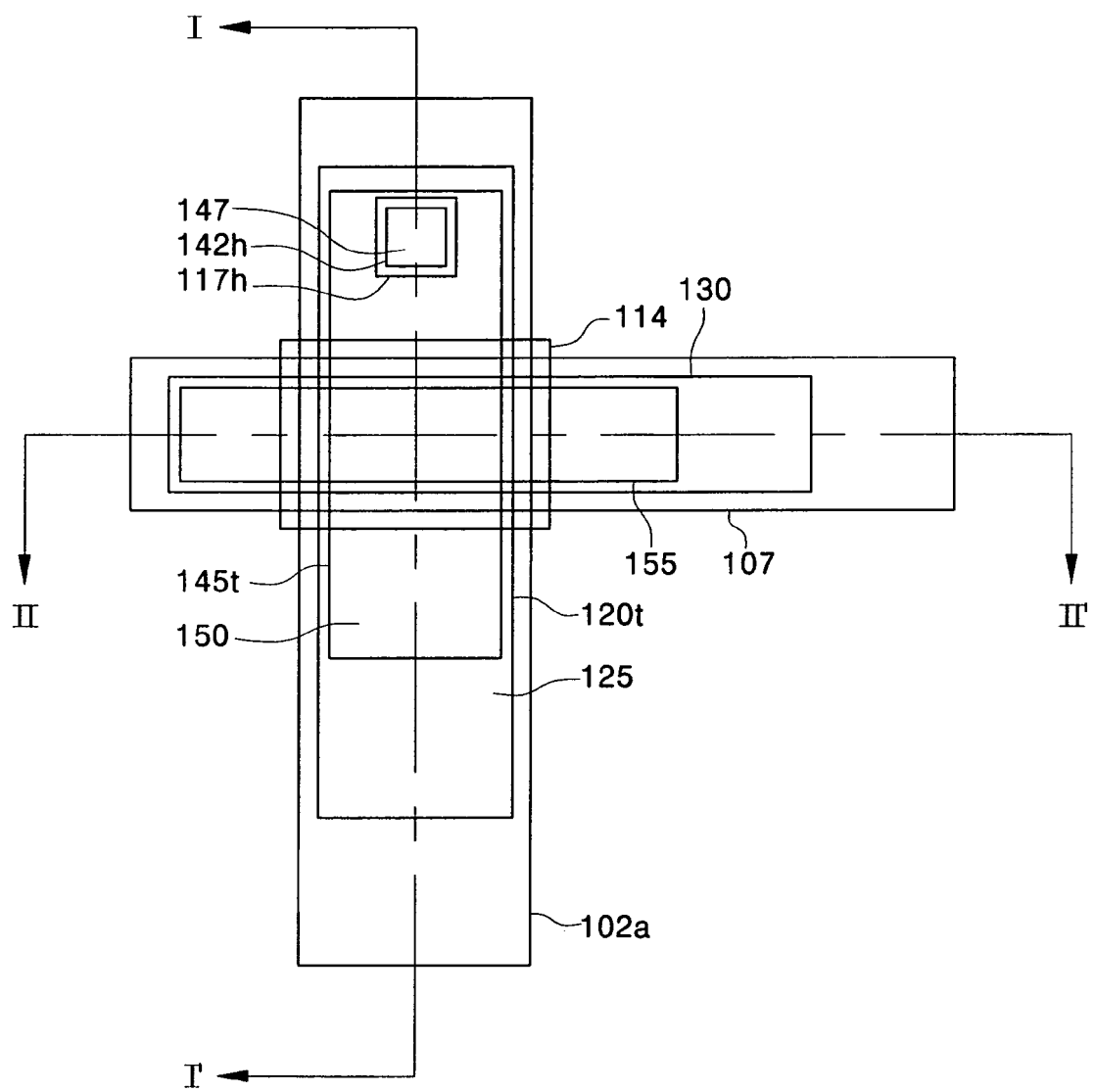
Figure 7B:
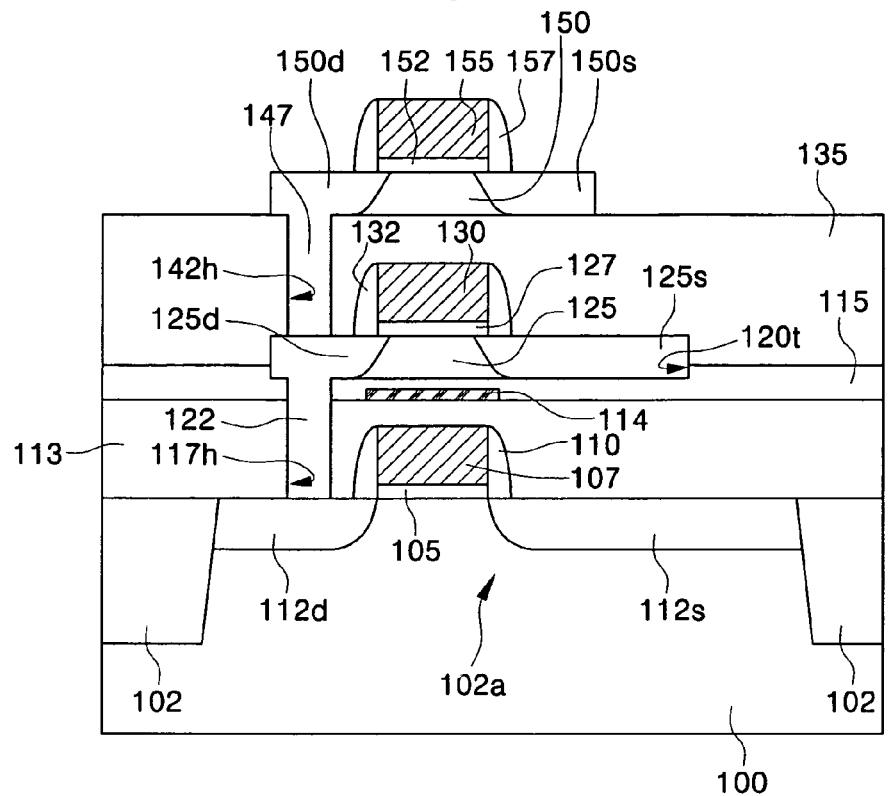
Figure 7C:
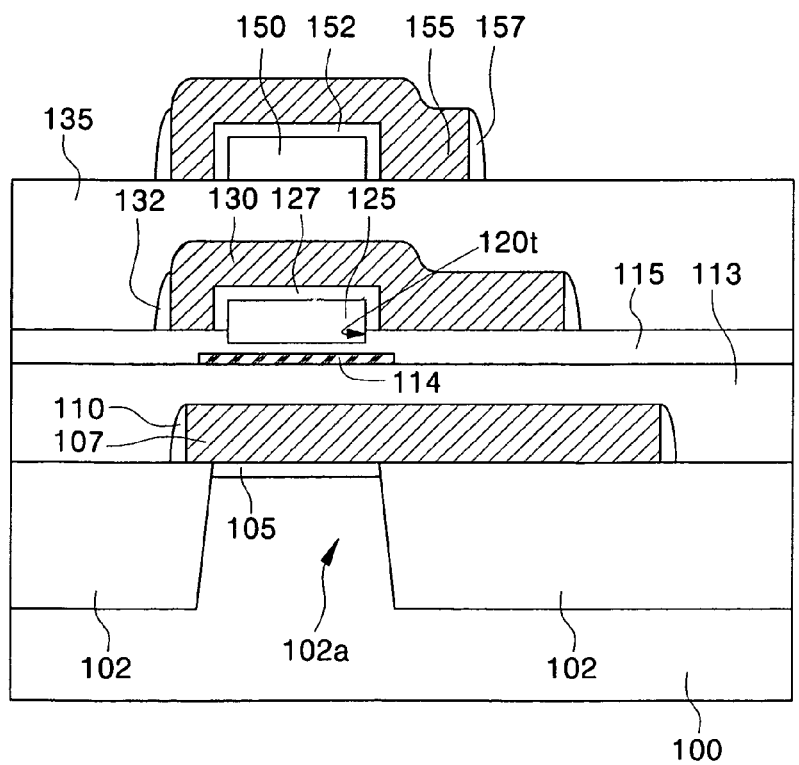

Referring to FIGS. 7A, 7B and 7C, the upper interlayer insulating layer 135 may be etched back to expose at least portions of sidewalls of the upper semiconductor body 150. In the present embodiment, the etch-back process is carried out until the entire sidewalls of the upper semiconductor body 150 are exposed. Thereafter, an upper gate electrode 155 is formed to cover and cross the exposed sidewalls and a top portion of a predetermined region of the upper semiconductor body 150. Before the upper gate electrode 155 is formed, an upper gate insulating layer 152 may be formed between the upper gate electrode 155 and the upper semiconductor body 150. An upper gate spacer 157 may be formed to cover sidewalls of the upper gate electrode 155 and the upper gate insulating layer 152 at the same time. Subsequently, impurity ions are implanted into the upper semiconductor body 150 using the upper gate electrode 155 and the upper gate spacer 157 as ion implantation masks, thereby forming an upper source region 150s and an upper drain region 150d. The upper source region 150s, the upper drain region 150d, and the upper gate electrode 155 constitute an upper TFT. As can be seen from FIG. 7A, the upper TFT may overlap the lower TFT. That is, the upper semiconductor body 150 may overlap the lower semiconductor body 125, and the upper gate electrode 155 may overlap the lower gate electrode 130.

Figure 8A:
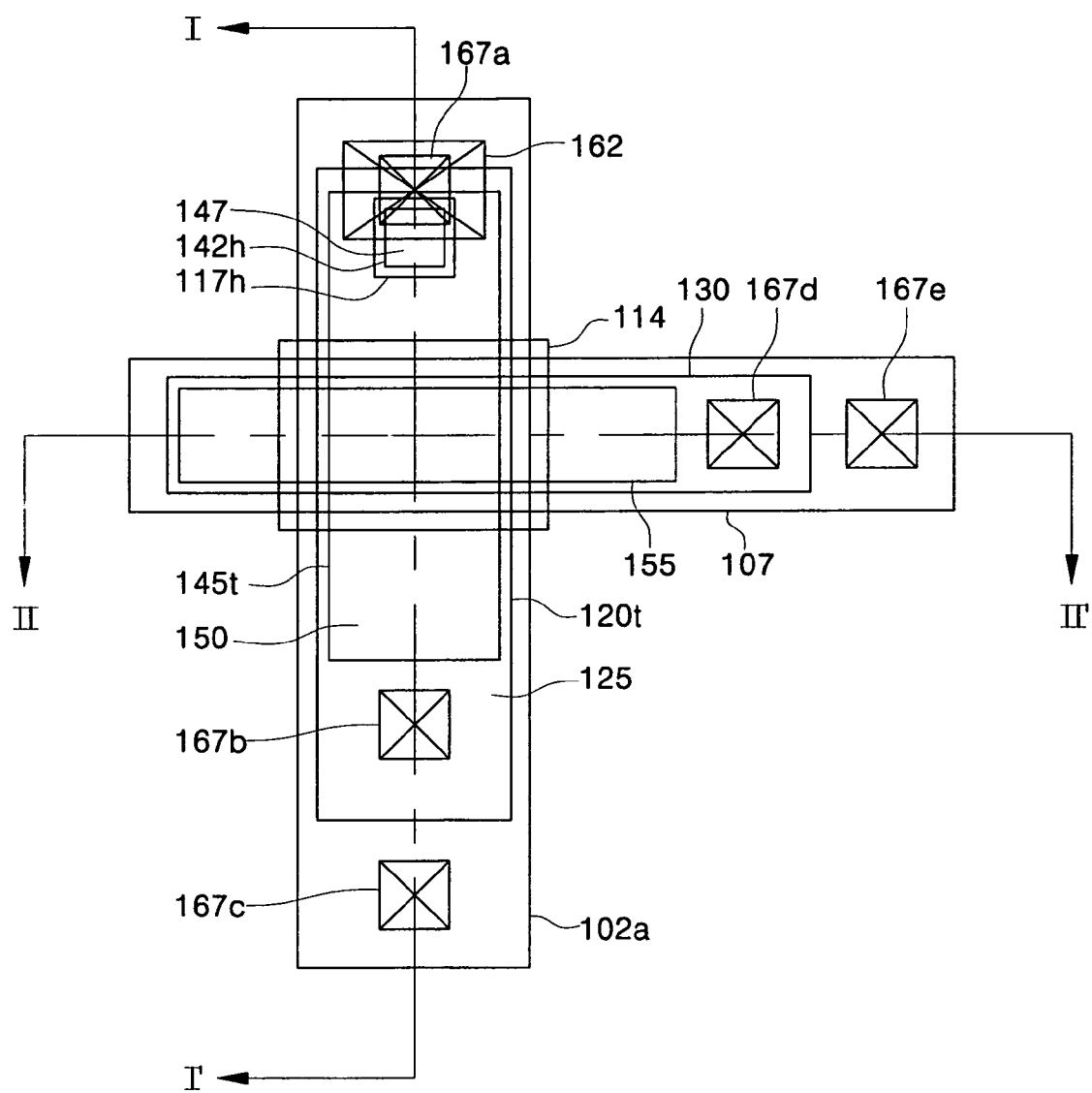
Figure 8B:
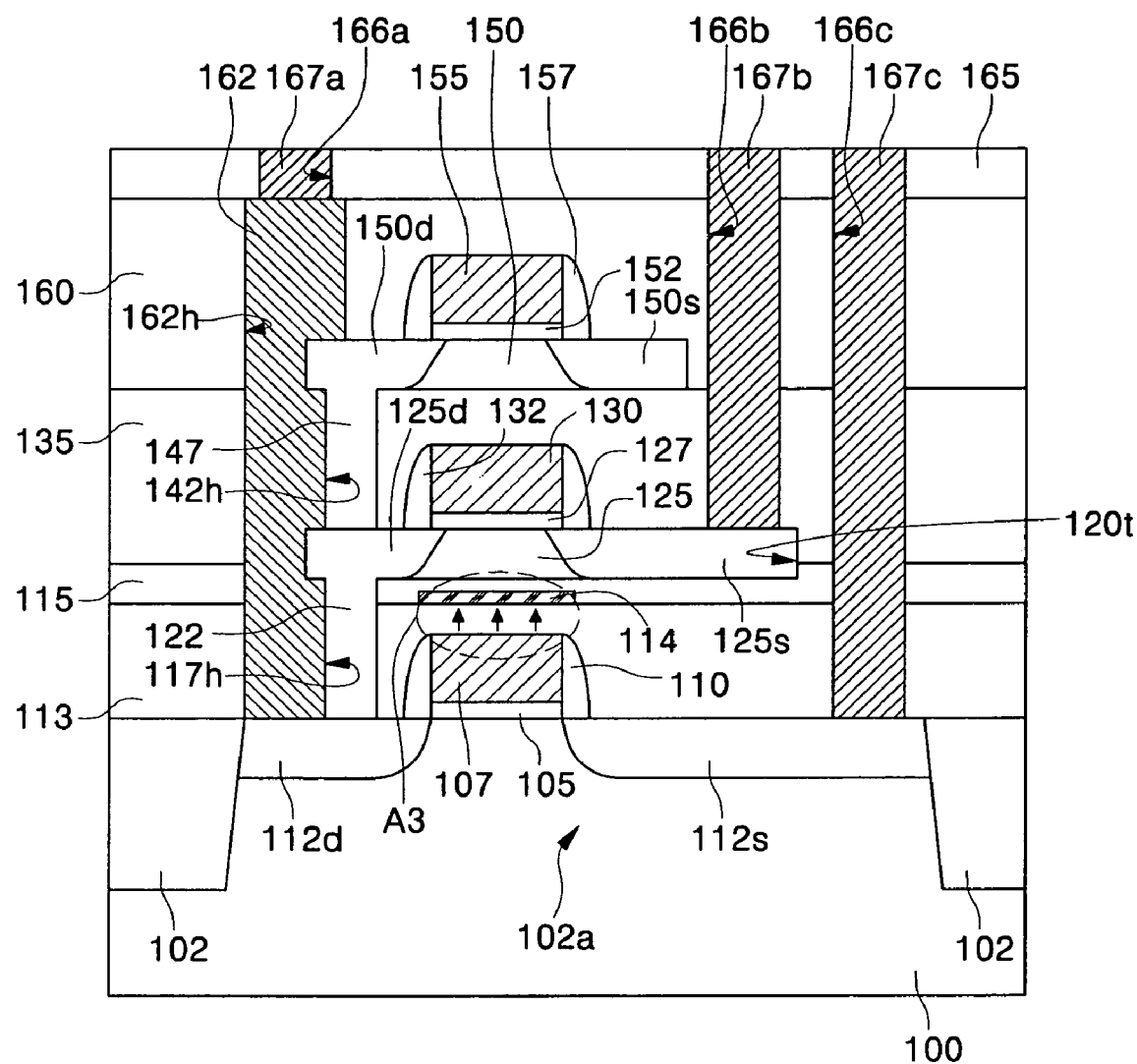
Figure 8C:
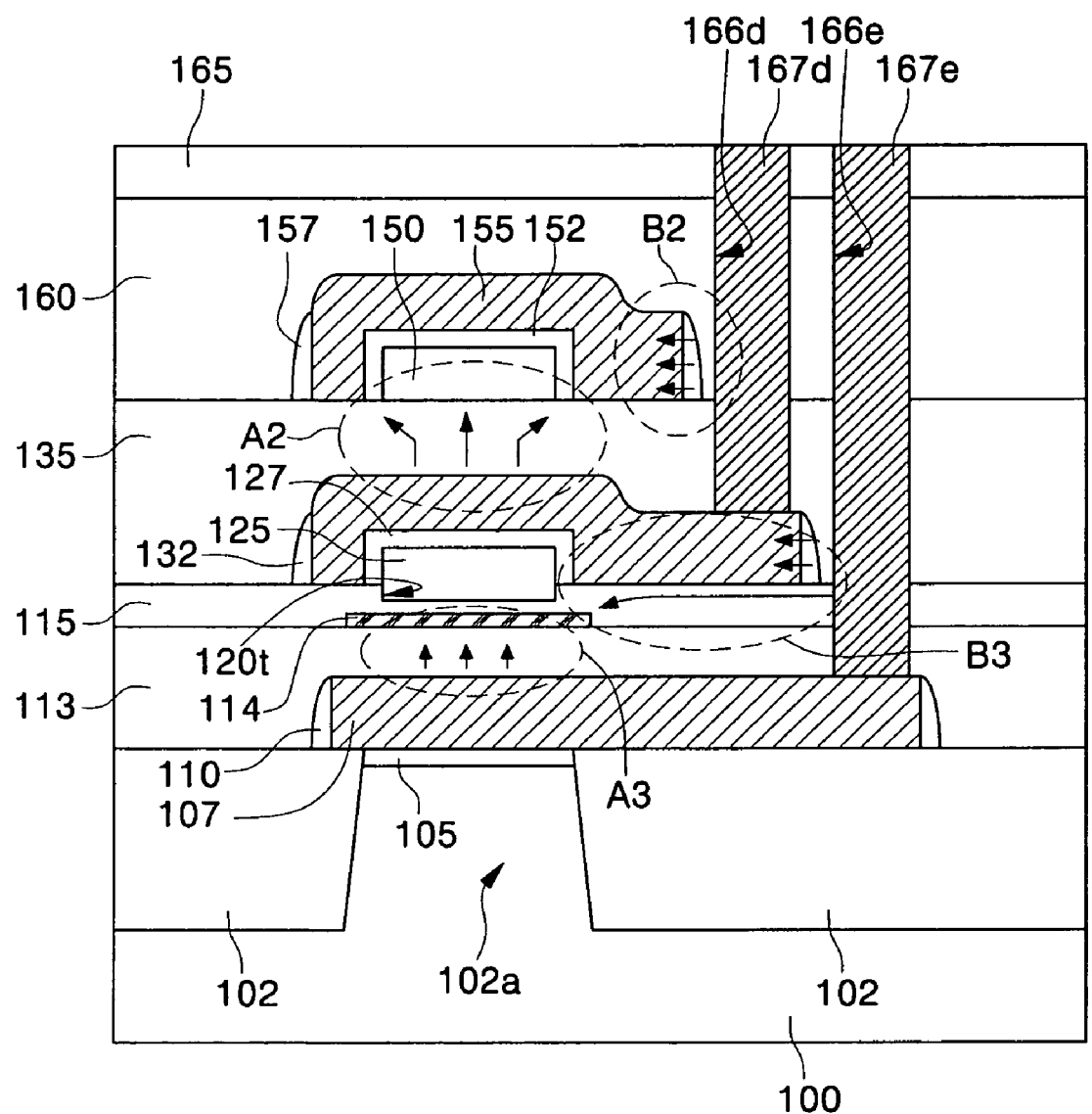

Referring to FIGS. 8A, 8B and 8C, a first interlayer insulating layer 160 is formed on the semiconductor substrate 100 having the upper TFT. When the lower semiconductor node plug 122 has the same conductivity type as the bulk drain region 112d, at least the lower and upper drain regions 125d and 150d may be exposed by a metal node contact hole 162h that is formed through the first interlayer insulating layer 160, the upper interlayer insulating layer 135, and the second and first lower interlayer insulating layers 115 and 113. Thereafter, a metal node plug 162 may be filled in the metal node contact hole 162h. As a result, the metal node plug 162 may be in contact with at least the lower and upper drain regions 125d and 150d.

When the lower semiconductor node plug 122 has a different conductivity type from the bulk drain region 112d, the metal node plug 162 may extend and come into contact with the bulk drain region 112d. Further, the metal node plug 162 may be in contact with not only the bulk, lower and upper drain regions 112d, 125d, and 150d but also the lower and upper semiconductor node plugs 122 and 147. The metal node plug 162 may be formed of a metal layer having an ohmic contact with both p-type and n-type semiconductors. For example, the metal node plug 162 may be formed of a tungsten plug.

A second interlayer insulating layer 165 is formed on the semiconductor substrate 100 having the first interlayer insulating layer 160 and the metal node plug 162. A first lower interconnection contact hole 166a may be formed through the second interlayer insulating layer 165 to expose the metal node plug 162, and a second lower interconnection contact hole 166b may be formed through the second and first interlayer insulating layers 165 and 160 and the upper interlayer insulating layer 135 to expose the lower source region 125s.

Also, a third lower interconnection contact hole 166c may be formed through the second and first interlayer insulating layers 165 and 160, the upper interlayer insulating layer 135, and the second and first lower interlayer insulating layers 115 and 113 to expose the bulk source region 112s, and a fourth lower interconnection contact hole 166d may be formed through the second and first interlayer insulating layers 165 and 160 and the upper interlayer insulating layer 135 to expose the lower gate electrode 130. Further, a fifth lower interconnection contact hole 166e may be formed through the second and first interlayer insulating layers 165 and 160, the upper interlayer insulating layer 135, and the second and first lower interlayer insulating layers 115 and 113 to expose the bulk gate electrode 107. The first through fifth lower interconnection contact holes 166a, 166b, 166c, 166d, and 166e may be filled with conductive layers, thereby forming first through fifth lower interconnection contact plugs 167a, 167b, 167c, 167d, and 167e, respectively.

As shown in FIG. 8C, the top and sidewalls of the upper semiconductor body 150 of the upper TFT are covered with the upper gate electrode 155, and the top and sidewalls of the lower semiconductor body 125 of the lower TFT are covered with the lower gate electrode 130. Thus, since the tops and sidewalls of the upper and lower semiconductor bodies 150 and 125 are affected by voltages at the upper and lower gate electrodes 155 and 130, respectively, they are not significantly affected by the energy potential of adjacent contacts as can be seen from reference characters 'B2' and 'B3', respectively. Also, as can be seen from reference character 'A2,' even if a bottom surface of the upper semiconductor body 150 is exposed to surroundings, the upper gate electrode 155 that covers the sidewalls of the upper semiconductor body 150 may reduce the influence of the voltage at the lower gate electrode 130. Also, as can be seen from reference character 'A3,' the floating conductive layer pattern 114, which is formed between the bulk MOS transistor and the lower TFT, may protect a bottom surface of the lower semiconductor body 125 from the influence of the voltage at the bulk gate electrode 107. Further, an off voltage can be applied to the floating conductive layer pattern 114.

In addition, since all the top and sidewalls of the lower semiconductor body 125 disposed between the lower drain and source regions 125d and 125s can be used as a channel region, a channel width may increase. Similarly, all the top and sidewalls of the upper semiconductor body 150 disposed between the upper drain and source regions 150d and 150s are used as a channel region so that a channel width may increase. Therefore, a narrow width effect, which results from a reduction in the channel width due to high integration density, may be prevented.

FIGS. 9A, 10A, 11A, and 12A are plan views illustrating a method of fabricating a semiconductor device having a TFT according to another exemplary embodiment of the present invention, FIGS. 9B, 10B, 11B, and 12B are cross-sectional views taken along lines I-I' of FIGS. 9A, 10A, 11A, and 12A, respectively, and FIGS. 9C, 10C, 11C, and 12C are cross-sectional views taken along lines II-II' of FIGS. 9A, 1A, 11A, and 12A, respectively.

Figure 9A:
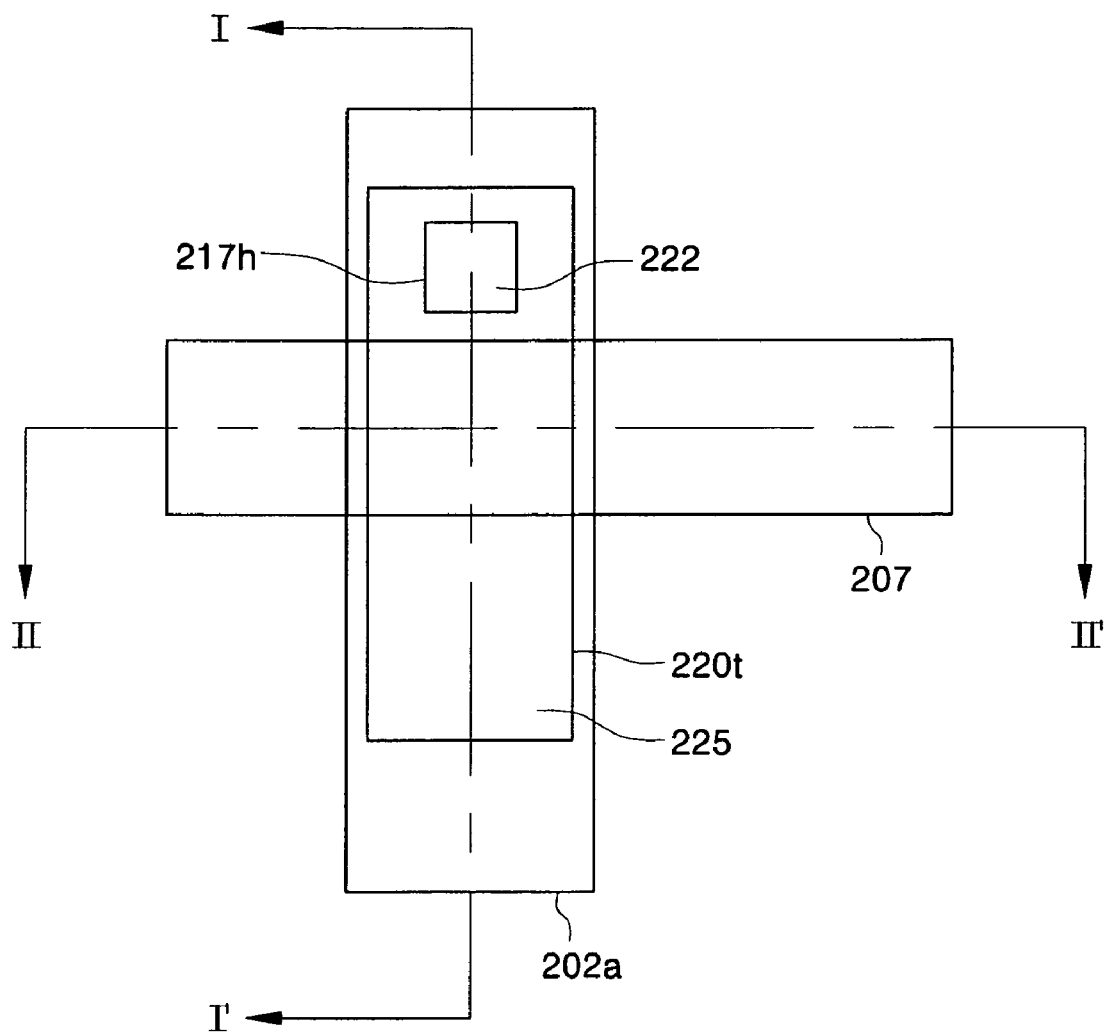
FIGS. 9A, 10A, 11A, and 12A are plan views illustrating a method of fabricating a semiconductor device having a TFT according to another exemplary embodiment of the present invention.
Figure 9B:
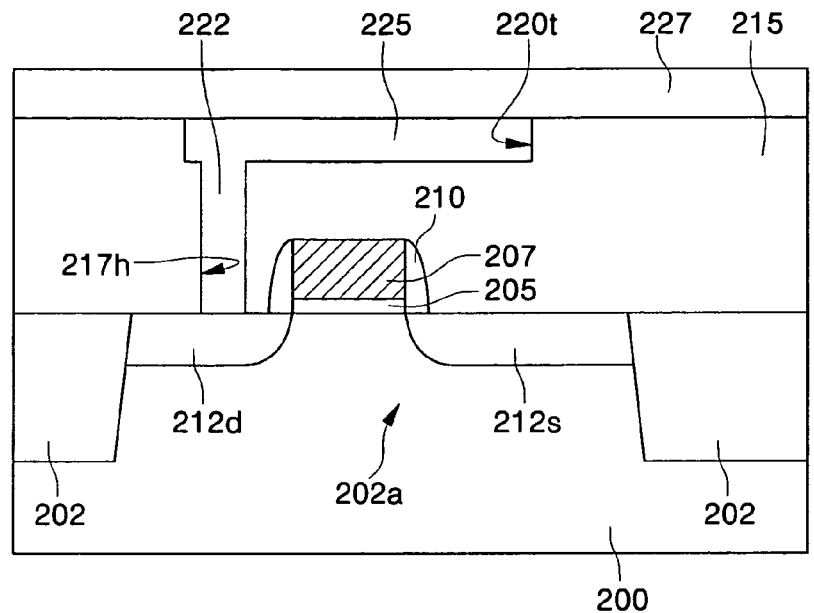
FIGS. 9B, 10B, 11B, and 12B are cross-sectional views taken along lines I-I' of FIGS. 9A, 10A, 11A, and 12A, respectively.
Figure 9C:
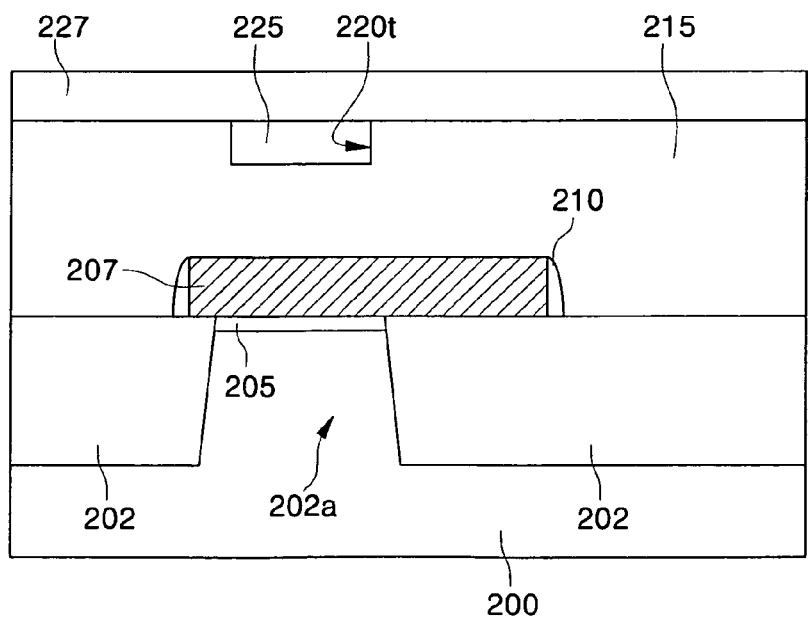
FIGS. 9C, 10C, 11C, and 12C are cross-sectional views taken along lines II-II' of FIGS. 9A, 10A, 11A, and 12A, respectively.

Referring to FIGS. 9A, 9B and 9C, an isolation layer 202 is formed in a predetermined region of a semiconductor substrate 200 to define an active region 202a. A bulk gate electrode 207 is formed across the active region 202a on the semiconductor substrate 200 having the active region 202a. Before the bulk gate electrode 207 is formed, a bulk gate insulating layer 205 may be formed between the bulk gate electrode 207 and the active region 202a. A bulk gate spacer 210 may be formed to cover sidewalls of the bulk gate electrode 207 and the bulk gate insulating layer 205 at the same time. Impurity ions are implanted into the semiconductor substrate 200 using the bulk gate electrode 207 and the bulk gate spacer 210 as ion implantation masks, thereby forming a bulk source region 212s and a bulk drain region 212d in the active region 202a. The bulk gate electrode 207, the bulk source region 212s, and the bulk drain region 212d constitute a bulk MOS transistor.

A planarized first lower interlayer insulating layer 215 is formed on the semiconductor substrate 200 having the bulk MOS transistor. The first lower interlayer insulating layer 215 may be patterned to form a lower node contact hole 217h that exposes the bulk drain region 212d. Thereafter, a trench 220t may be formed in the first lower interlayer insulating layer 215. The trench 220t may overlap the active region 202a such that it includes the lower node contact hole 217h. Alternatively, after the trench 220t is first formed, the lower node contact hole 217h may be formed.

A lower semiconductor node plug 222 may be formed in the lower node contact hole 217h by a SEG process using the bulk drain region 212d as a seed layer. Accordingly, when the semiconductor substrate 200 is a single crystalline semiconductor substrate, the lower semiconductor node plug 222 may also have a single crystalline structure. A lower semiconductor body 225 may be filled in the trench 220t using the lower semiconductor node plug 222 as a seed layer. Accordingly, when the lower semiconductor node plug 222 is a single crystalline semiconductor plug, the lower semiconductor body 225 may also have a single crystalline structure. A second lower interlayer insulating layer 227 is formed on the first lower interlayer insulating layer 215 having the lower semiconductor body 225.

Figure 10A:
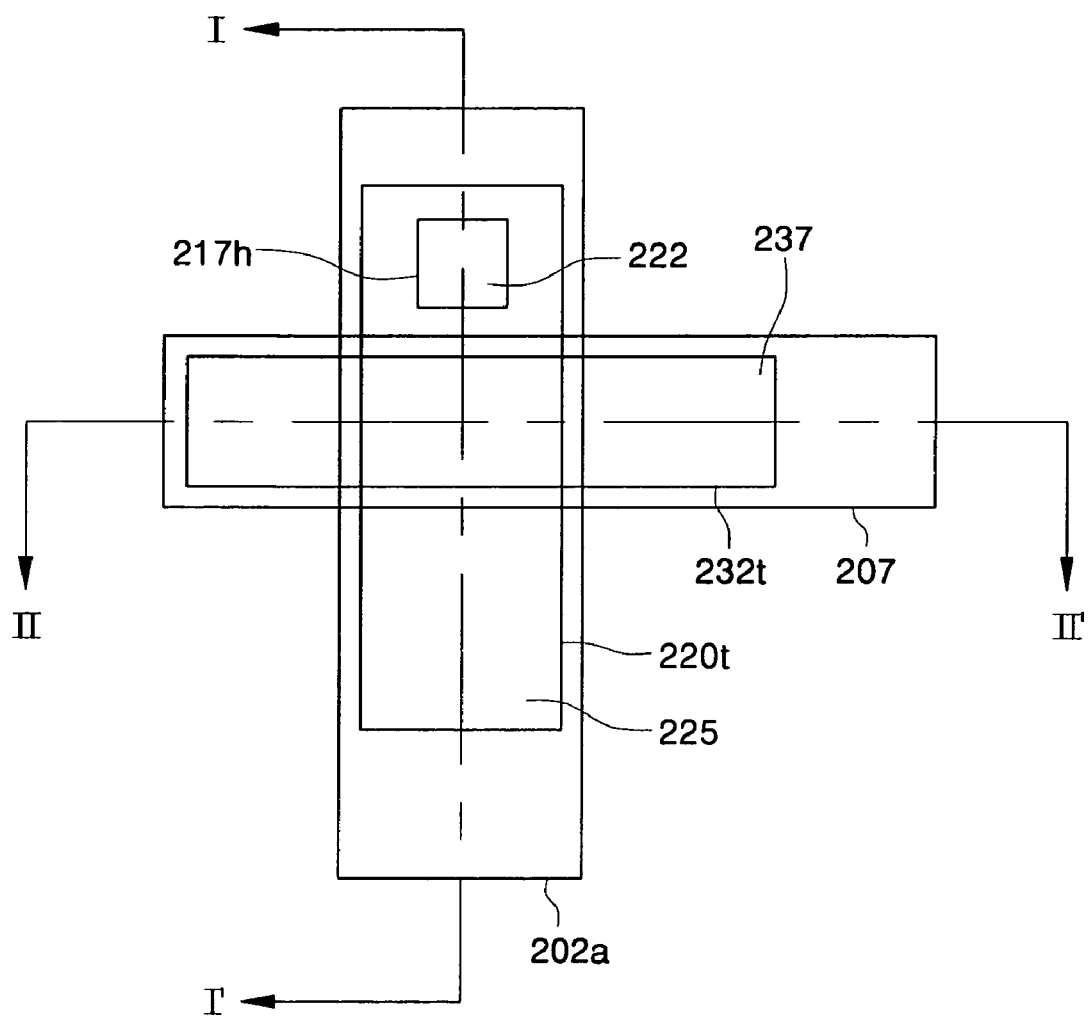
Figure 10B:
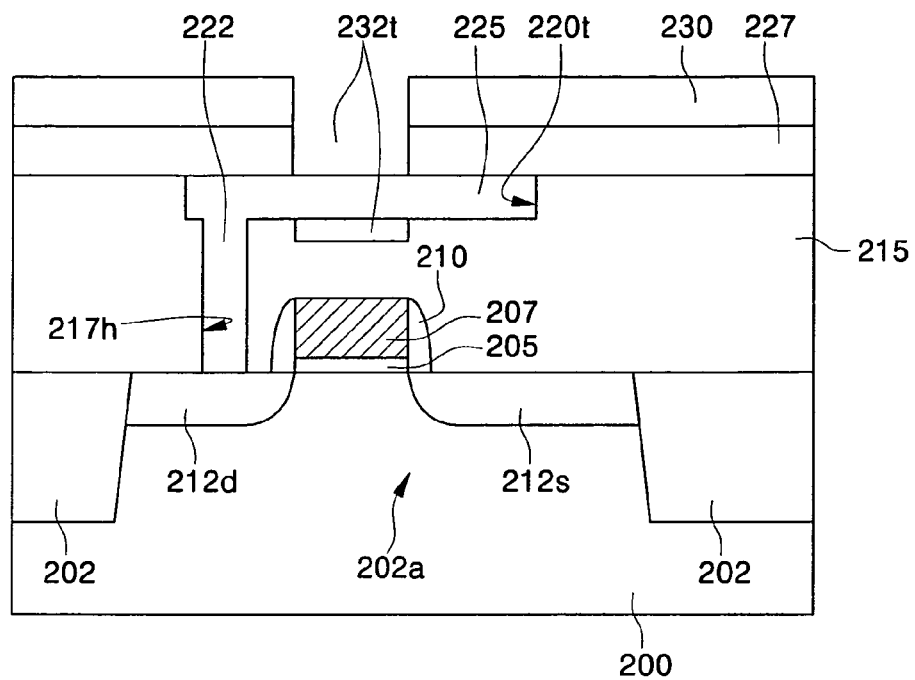
Figure 10C:
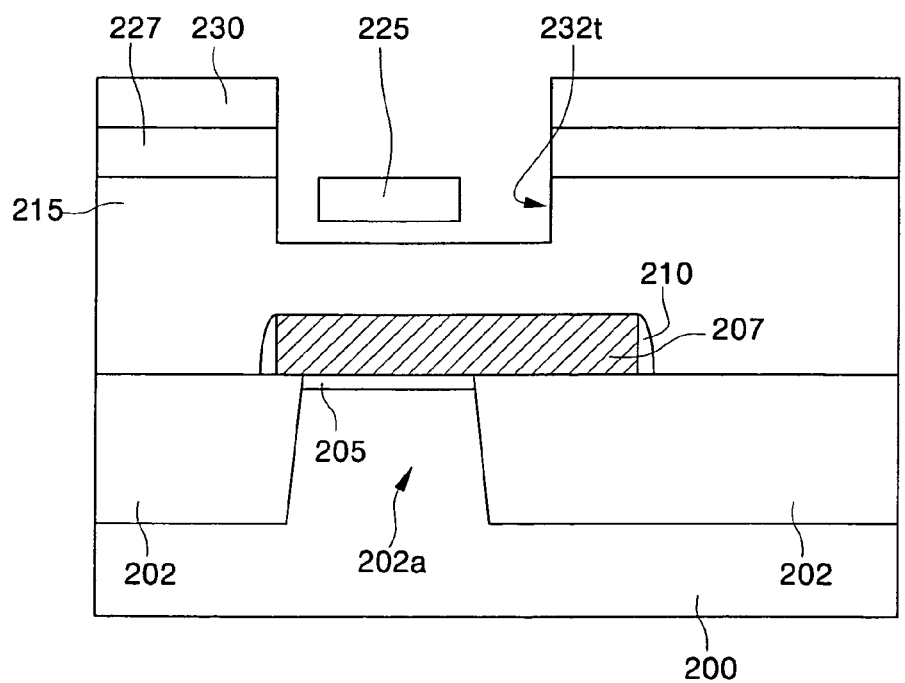

Referring to FIGS. 10A, 10B and 10C, a mask pattern 230 may be formed on the second lower interlayer insulating layer 227 to expose a predetermined region of the second lower interlayer insulating layer 227. Thereafter, the second and first lower interlayer insulating layers 227 and 215 are selectively and sequentially etched using the mask pattern 230 as an etch mask, thereby forming a gate trench 232t that exposes a top portion, sidewalls, and a bottom portion of a predetermined region of the lower semiconductor body 225.

Figure 11A:
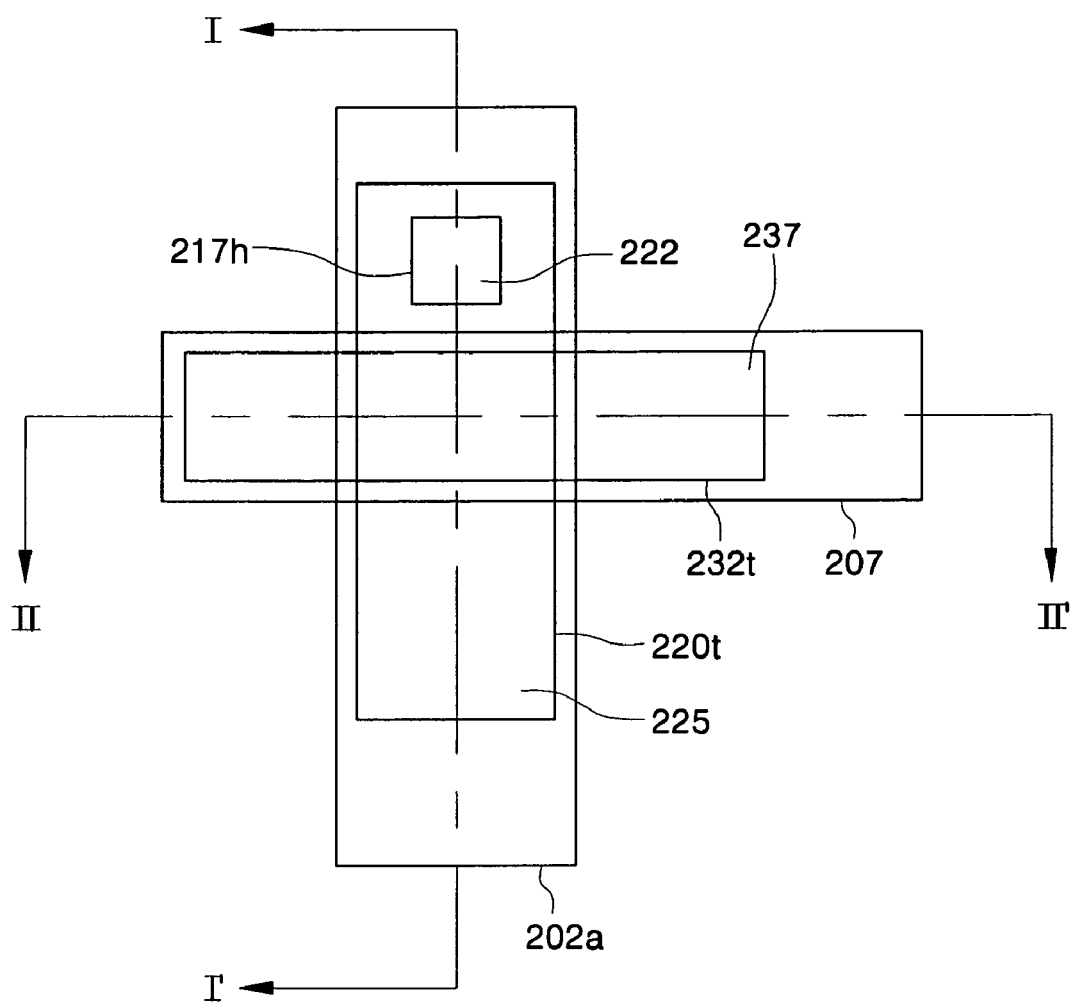
Figure 11B:
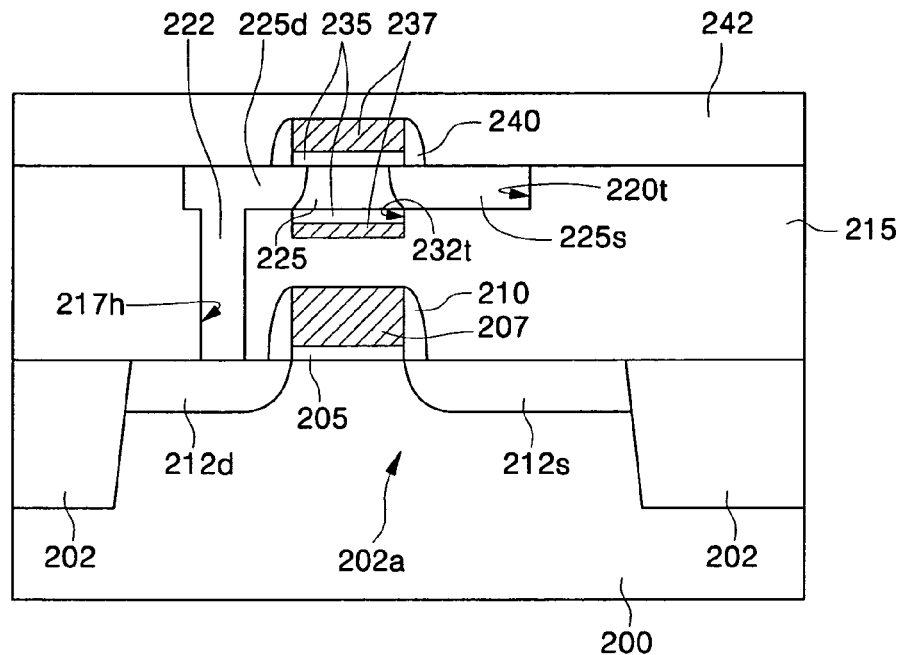
Figure 11C:
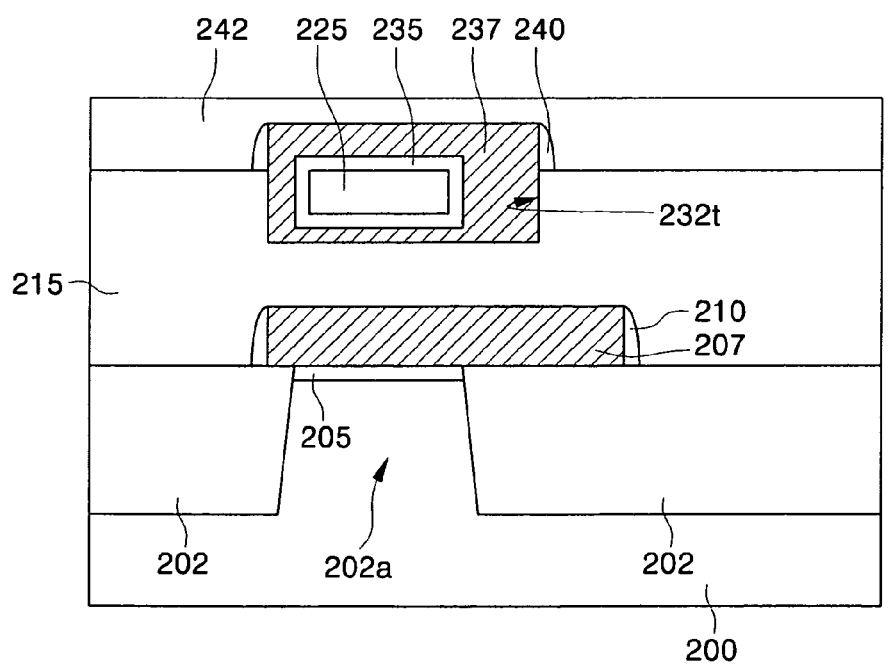

Referring to FIGS. 11A, 11B and 11C, after the gate trench 232t is formed, the mask pattern 230 is removed. A lower gate electrode 237 is formed in the gate trench 232t such that it cover and cross the exposed top portion, sidewalls, and bottom portion of the lower semiconductor body 225. The lower gate electrode 237 may be formed of polysilicon having good step coverage. Thus, a space below the lower semiconductor body 225 may be completely filled. Before the lower gate electrode 237 is formed, a lower gate insulating layer 235 may be formed between the lower semiconductor body 225 and the lower gate electrode 237 to cover the exposed top portion, sidewalls, and bottom portion of the lower semiconductor body 225. The lower gate insulating layer 235 may be formed by a thermal oxidation process.

After the lower gate electrode 237 is formed, the second lower interlayer insulating layer 227 is selectively removed to expose a top surface of the lower semiconductor body 225. A lower gate spacer 240 may be formed to cover sidewalls of the lower gate insulating layer 235 and the lower gate electrode 237. By using the lower gate electrode 237 and the lower gate spacer 240 as ion implantation masks, impurity ions are implanted into the lower semiconductor body 225, thereby forming a lower source region 225s and a lower drain region 225d. The lower source region 225s, the lower drain region 225d, and the lower gate electrode 237 constitute a lower TFT. As can be seen from FIG. 11A, the lower TFT may overlap the bulk MOS transistor. That is, the lower semiconductor body 225 may overlap the active region 202a, and the lower gate electrode 230 may overlap the bulk gate electrode 207. A first interlayer insulating layer 242 may be formed on the semiconductor substrate 200 having the lower TFT.

Figure 12A:
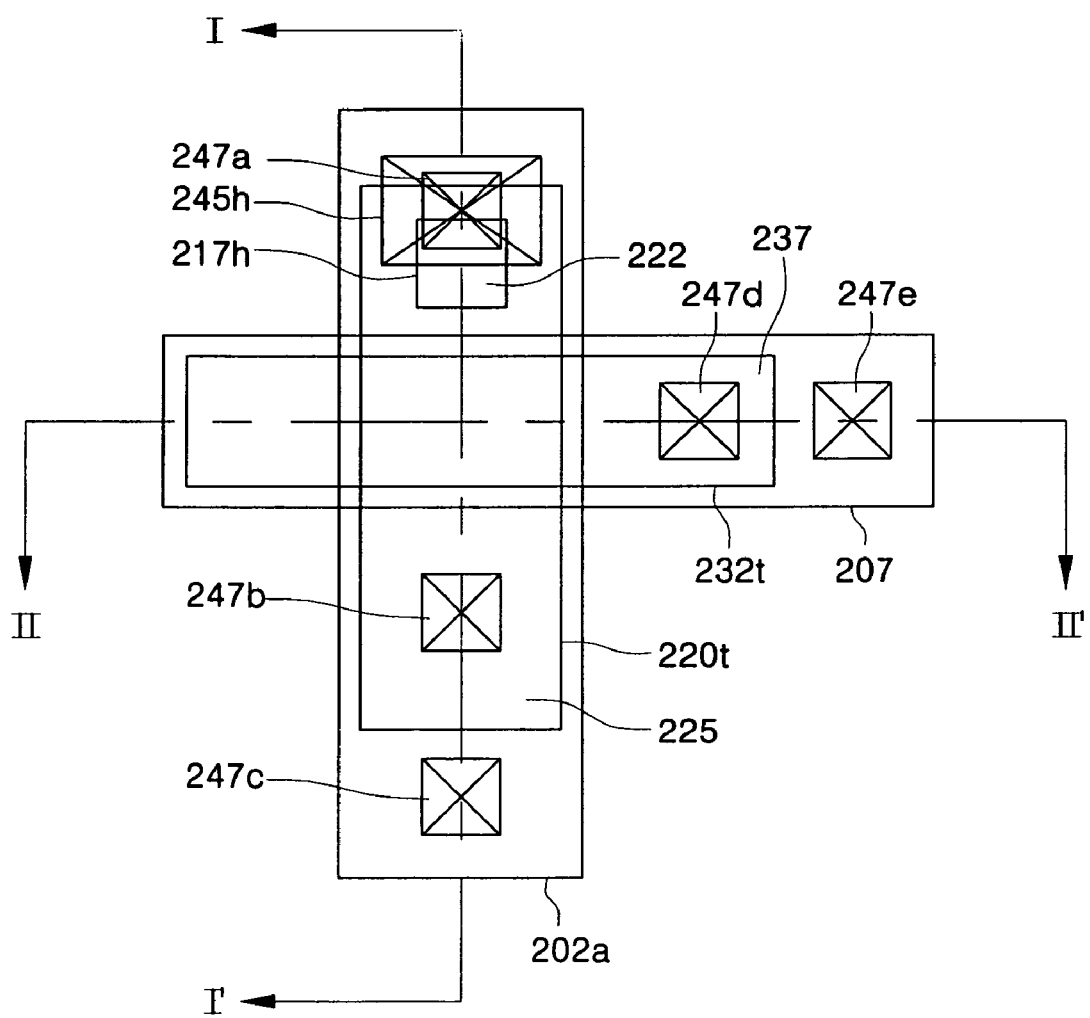
Figure 12B:
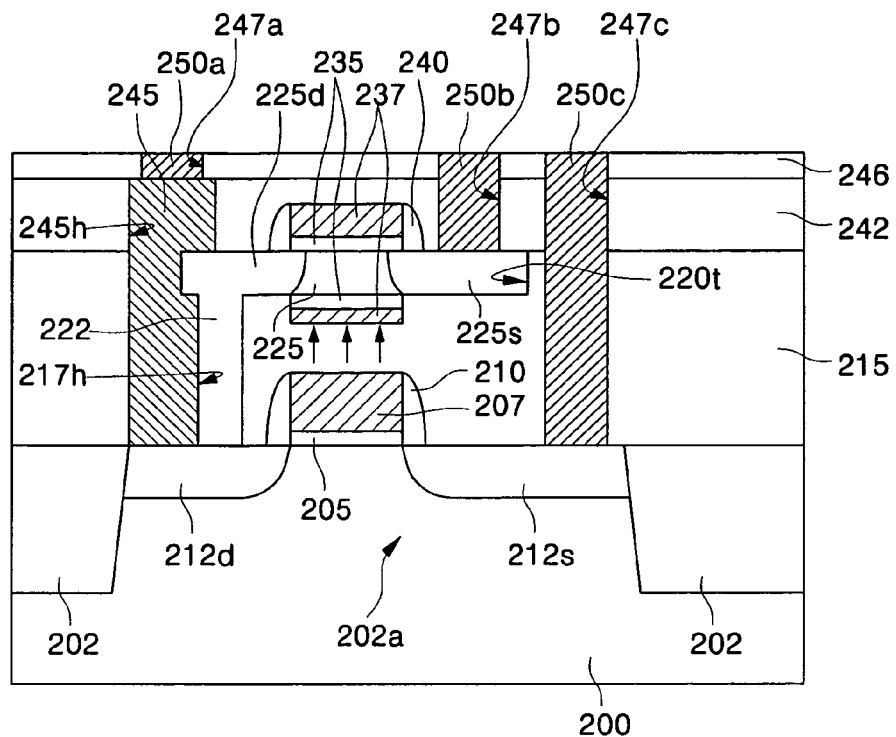
Figure 12C:
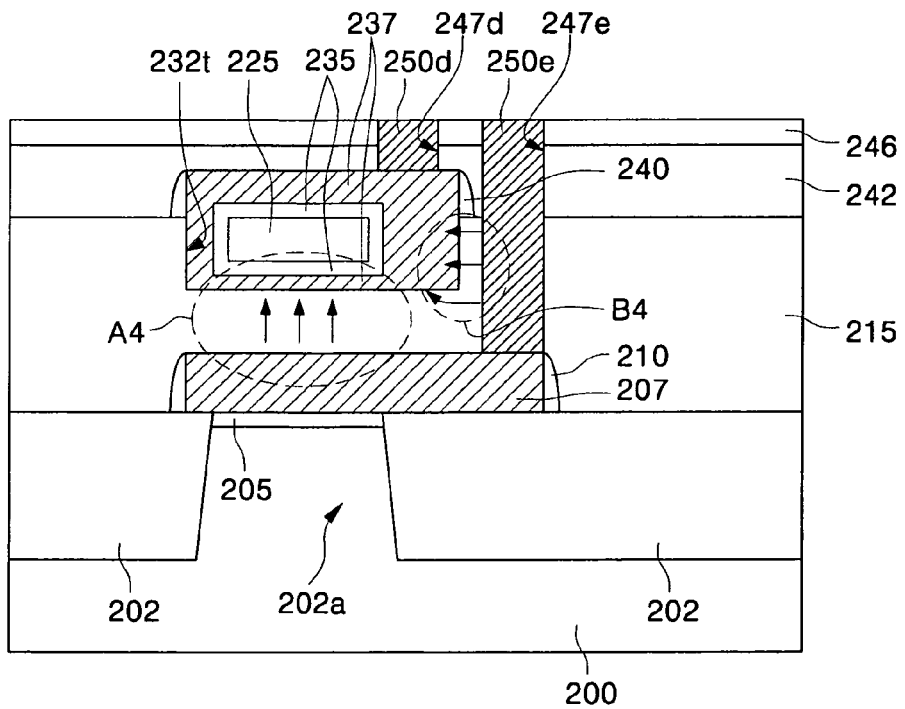

Referring to FIGS. 12A, 12B and 12C, when the lower semiconductor node plug 222 has the same conductivity type as the bulk drain region 212d, at least the lower drain region 225d may be exposed by a metal node contact hole 245h that is formed through the first interlayer insulating layer 242 and the first lower interlayer insulating layer 113. Subsequently, a metal node plug 245 may be filled in the metal node contact hole 245h. As a result, the metal node plug 245 may be formed in contact with at least the lower drain region 225d.

Meanwhile, when the lower semiconductor node plug 222 has a different conductivity type from the bulk drain region 212d, the metal node plug 245 may extend and come into contact with the bulk drain region 212d. Further, the metal node plug 245 may be in contact with not only the bulk and lower drain regions 212d and 225d but also the semiconductor node plug 222. The metal node plug 245 may be formed of a metal layer having an ohmic contact with both p-type and n-type semiconductors. For example, the metal node plug 245 may be formed of a tungsten plug.

A second interlayer insulating layer 246 is formed on the semiconductor substrate 200 having the first interlayer insulating layer 242 and the metal node plug 245. A first lower interconnection contact hole 247a may be formed through the second interlayer insulating layer 246 to expose the metal node plug 245, and a second lower interconnection contact hole 247b may be formed through the second and first interlayer insulating layers 246 and 242 to expose the lower source region 225s. Also, a third lower interconnection contact hole 247c may be formed through the second, first, and lower interlayer insulating layers 246, 242, and 215 to expose the bulk source region 212s, and a fourth lower interconnection contact hole 247d may be formed through the second and first interlayer insulating layers 246 and 242 to expose the lower gate electrode 237.

Further, a fifth lower interconnection contact hole 247e may be formed through the second, first, and lower interlayer insulating layers 246, 242, and 215 to expose the bulk gate electrode 207. The first through fifth lower interconnection contact holes 247a, 247b, 247c, 247d, and 247e may be filled with conductive layers, thereby forming first through fifth lower interconnection contact plugs 250a, 250b, 250c, 250d, and 250e, respectively.

As shown in FIG. 12C, the top portion, sidewalls, and bottom portion of the lower semiconductor body 225 disposed between the lower drain and source regions 225d and 225s are covered by the lower gate electrode 237. Accordingly, since all the surfaces of the lower semiconductor body 225 disposed between the lower drain and source regions 225d and 225s are affected by a voltage at the lower gate electrode 237, they are hardly affected by the energy potential of adjacent contacts and the bulk gate electrode 207 as can be seen from reference characters 'A4' and 'B4.' Also, all the top and bottom portions and sidewalls of the lower semiconductor body 225 disposed between the lower drain and source regions 225d and 225s may be used as a channel region, so that a channel width may increase. As a result, a narrow width effect, which results from a reduction in the channel width due to high integration density, may be prevented.

Figure 13A:
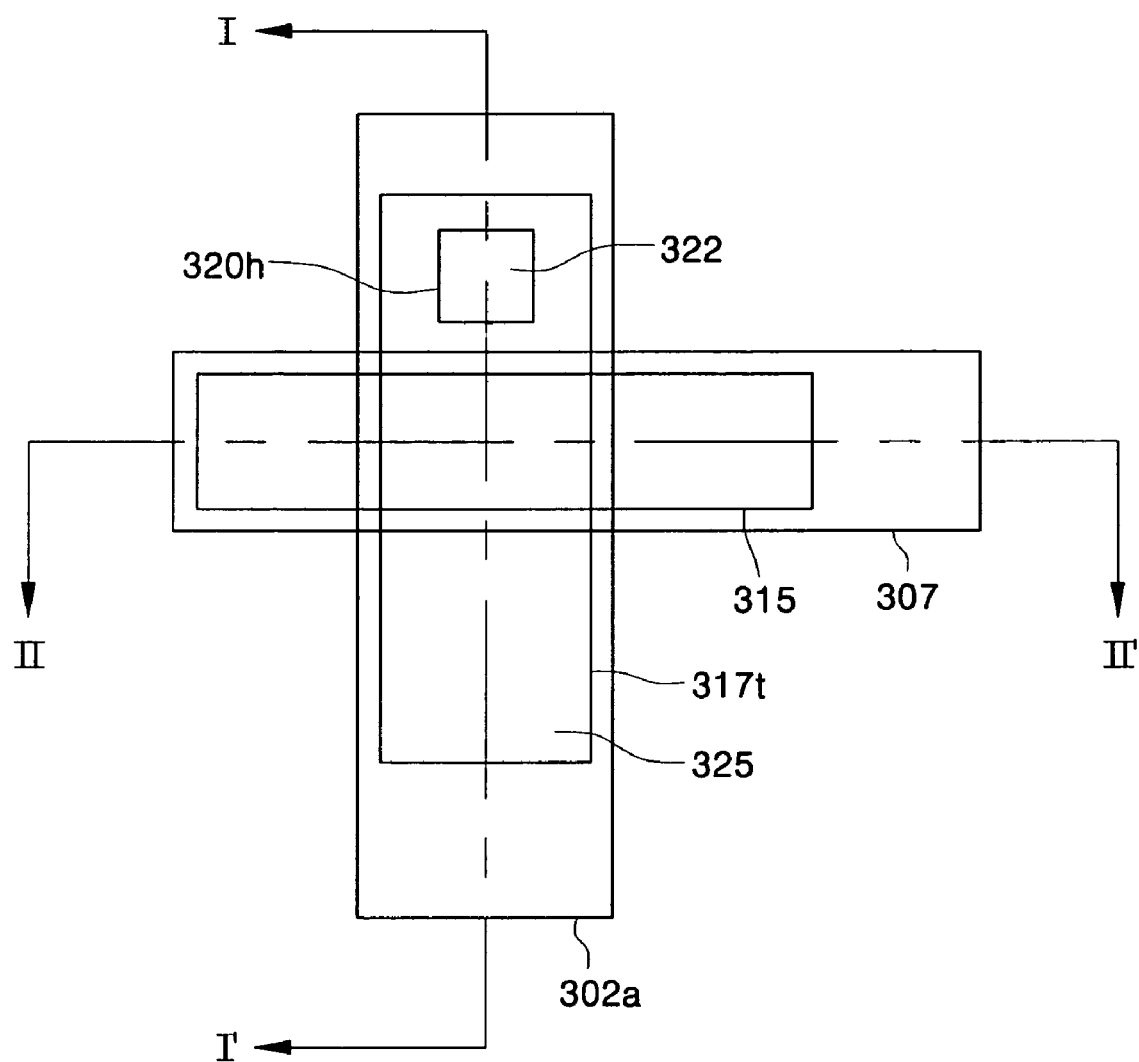
FIGS. 13A and 14A are plan views illustrating a method of fabricating a semiconductor device having a TFT according to yet another exemplary embodiment of the present invention.
Figure 13B:
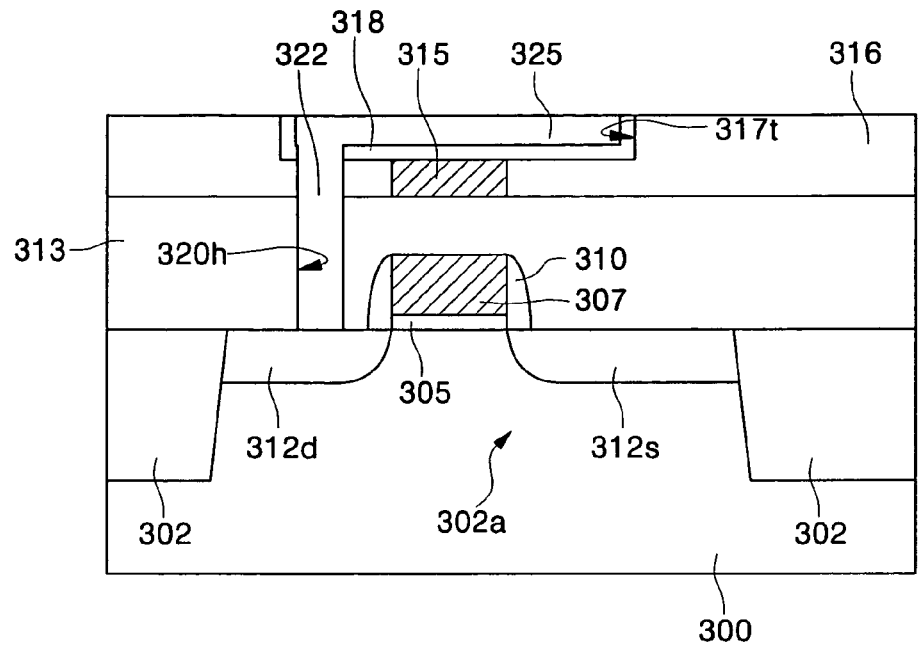
FIGS. 13B and 14B are cross-sectional views taken along lines I-I' of FIGS. 13A and 14A, respectively.
Figure 13C:
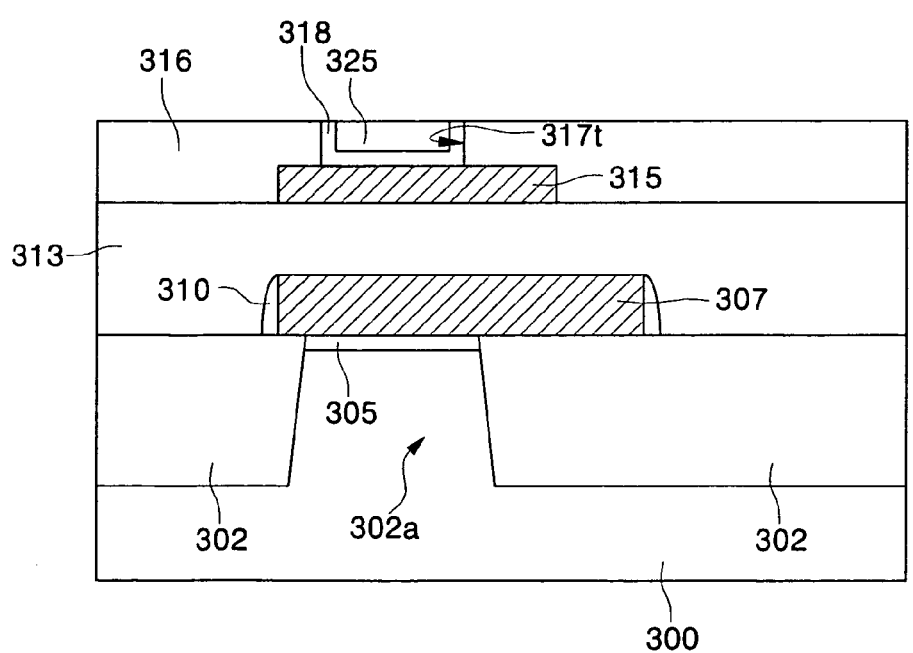
FIGS. 13C and 14C are cross-sectional views taken along lines II-II' of FIGS. 13A and 14A, respectively.
Figure 14A:
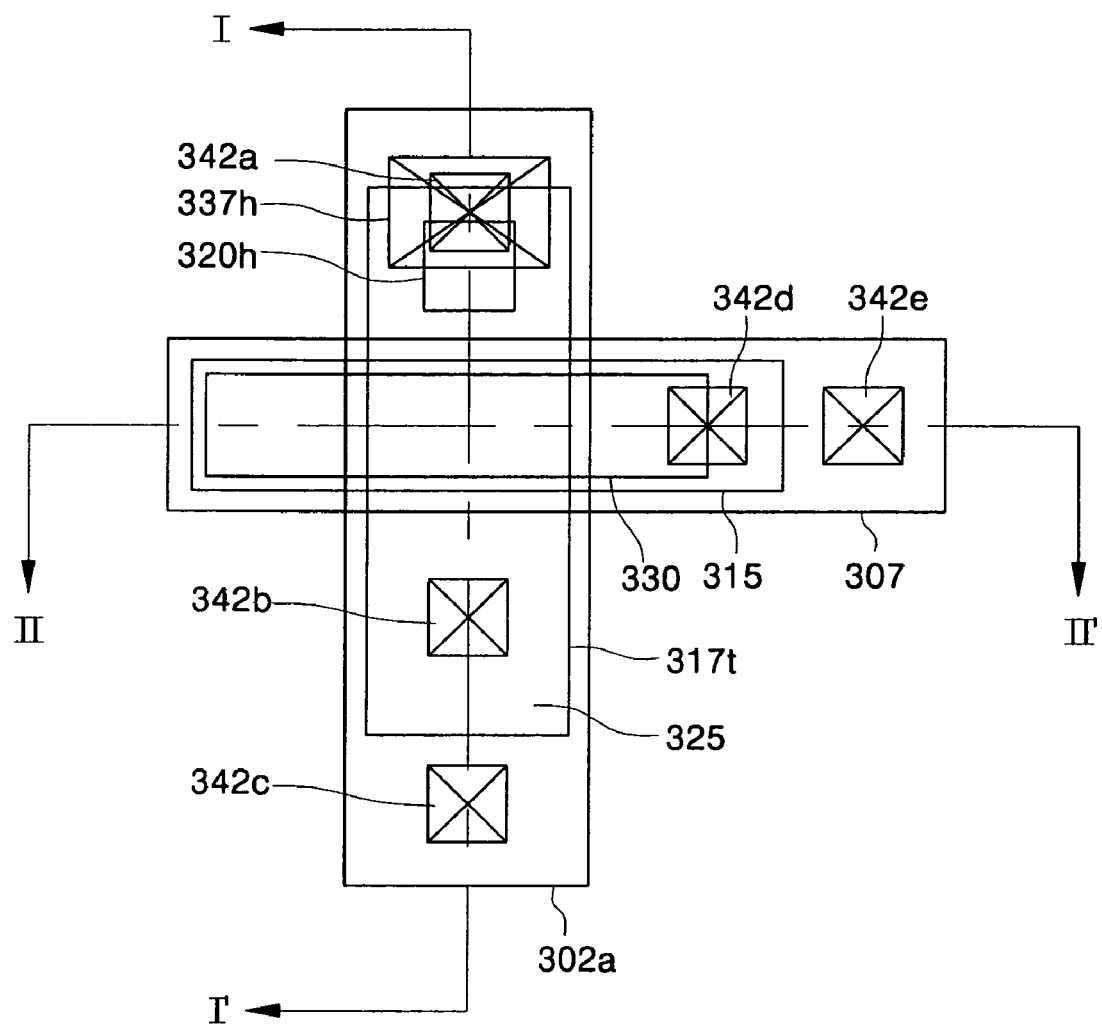
Figure 14B:
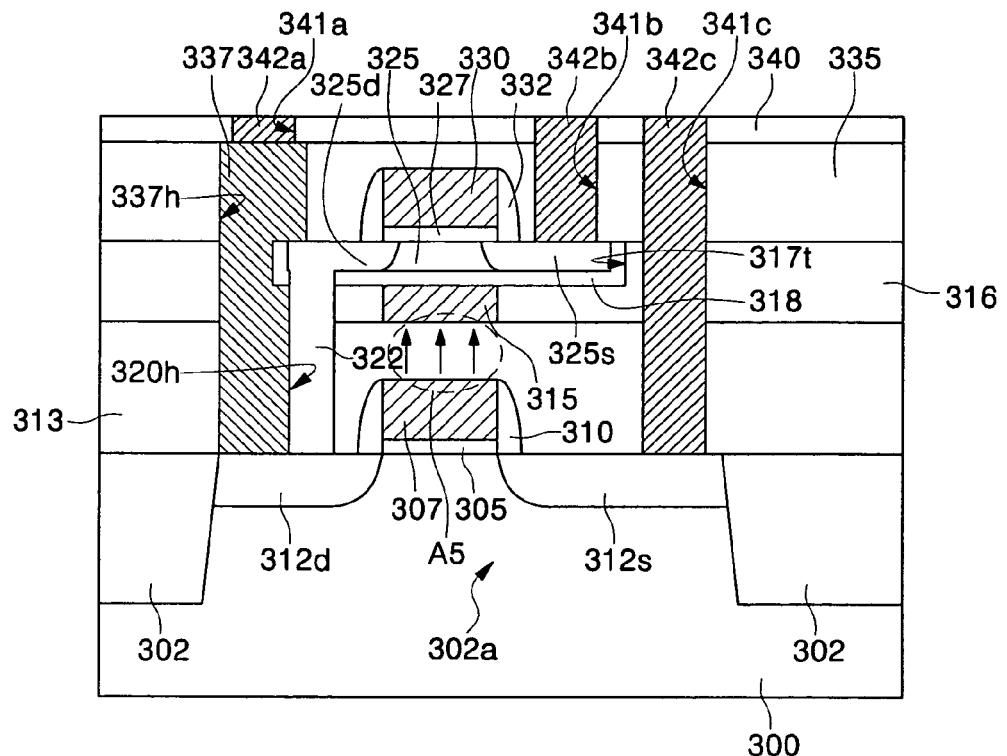
Figure 14C:
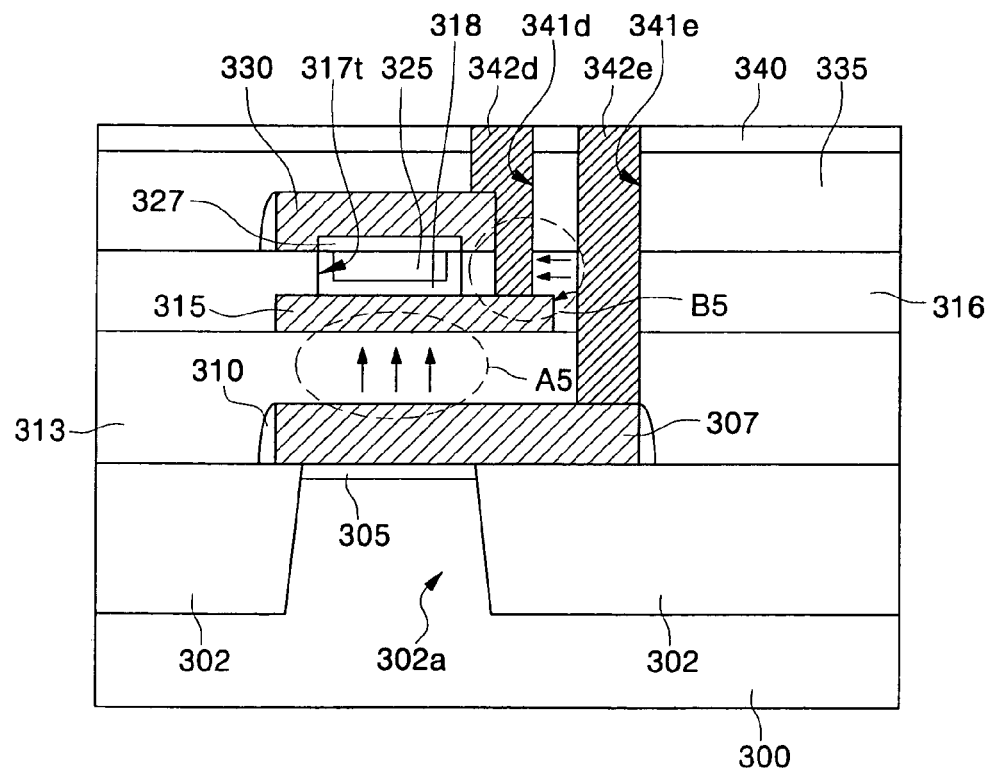

FIGS. 13A and 14A are plan views illustrating a method of fabricating a semiconductor device having a TFT according to yet another exemplary embodiment of the present invention, FIGS. 13B and 14B are cross-sectional views taken along lines I-I' of FIGS. 13A and 14A, respectively, and FIGS. 13C and 14C are cross-sectional views taken along lines II-II' of FIGS. 13A and 14A, respectively.

Referring to FIGS. 13A, 13B and 13C, an isolation layer 302 is provided in a predetermined region of a semiconductor substrate 300 to define an active region 302a. A bulk gate electrode 307 is formed across the active region 302a on the semiconductor substrate 300 having the active region 302a. Before the bulk gate electrode 307 is formed, a bulk gate insulating layer 305 may be formed between the bulk gate electrode 307 and the active region 302a. A bulk gate spacer 310 may be formed to cover sidewalls of the bulk gate electrode 307 and the bulk gate insulating layer 305. By using the bulk gate electrode 307 and the bulk gate spacer 310 as ion implantation masks, impurity ions are implanted into the semiconductor substrate 300, thereby forming a bulk source region 312s and a bulk drain region 312d in the active region 302a. The bulk gate electrode 307, the bulk source region 312s, and the bulk drain region 312d constitute a bulk MOS transistor.

A planarized first lower interlayer insulating layer 313 is formed on the semiconductor substrate 300 having the bulk MOS transistor. A first lower gate electrode 315 is formed to cover a predetermined region of the first lower interlayer insulating layer 313. The first lower gate electrode 315 may overlap the bulk gate electrode 307. A planarized second lower interlayer insulating layer 316 is formed on the semiconductor substrate 300 having the first lower gate electrode 315. A trench 317t is formed in the second lower interlayer insulating layer 316. The trench 317t may overlap the active region 302a. In this case, the trench 317t may be formed to expose a top surface of the first lower gate electrode 315. A first lower gate insulating layer 318 may be conformally formed in the trench 317t. The first lower gate insulating layer 318, the second lower interlayer insulating layer 316, and the first lower interlayer insulating layer 313 are sequentially patterned so that a lower node contact hole 320h may be formed in the trench 317t to expose the bulk drain region 312d.

A lower semiconductor node plug 322 may be formed in the lower node contact hole 320h by a SEG process using the bulk drain region 312d as a seed layer. Accordingly, when the semiconductor substrate 300 is a single crystalline semiconductor substrate, the lower semiconductor node plug 322 may also have a single crystalline structure. Thereafter, a lower semiconductor body 325 may be filled in the trench 317t by a SEG process using the lower semiconductor node plug 322 as a seed layer. Accordingly, when the lower semiconductor node plug 322 is a single crystalline semiconductor plug, the lower semiconductor body 325 may also have a single crystalline structure.

Referring to FIGS. 14A, 14B and 14C, a second lower gate electrode 330 is formed to cross over the lower semiconductor body 325. Before the second lower gate electrode 330 is formed, a second lower gate insulating layer 327 may be formed between the second lower gate electrode 330 and the lower semiconductor body 325. A lower gate spacer 332 may be formed to cover sidewalls of the second lower gate electrode 330 and the second lower gate insulating layer 327. Thereafter, impurity ions may be implanted into the lower semiconductor body 325 using the second lower gate electrode 330 and the lower gate spacer 332 as ion implantation masks, thereby forming a lower source region 325s and a lower drain region 325d.

The lower source and drain regions 325s and 325d and the first and second lower gate electrodes 315 and 330 constitute a lower TFT. As can be seen from FIG. 14A, the lower TFT may overlap the bulk MOS transistor. That is, the lower semiconductor body 325 may overlap the active region 302a, and the lower gate electrodes 315 and 330 may overlap the bulk gate electrode 307.

A first interlayer insulating layer 335 may be formed on the semiconductor substrate 300 having the lower TFT. When the lower semiconductor node plug 322 has the same conductivity type as the bulk drain region 312d, at least the lower drain region 325d may be exposed by a metal node contact hole 337h that is formed through the first interlayer insulating layer 335, the second lower interlayer insulating layer 316, and the first lower interlayer insulating layer 313. Subsequently, a metal node plug 337 may be filled in the metal node contact hole 337h. As a result, the metal node plug 337 may be formed in contact with at least the lower drain region 325d.

When the lower semiconductor node plug 322 has a different conductivity type from the bulk drain region 312d, the metal node plug 337 may extend and come into contact with the bulk drain region 312d. Further, the metal node plug 337 may be in contact with not only the bulk and lower drain regions 312d and 325d but also the lower semiconductor node plug 322. The metal node plug 337 may be formed of a metal layer having an ohmic contact with both p-type and n-type semiconductor materials. For example, the metal node plug 337 may be formed of a tungsten plug.

A second interlayer insulating layer 340 is formed on the semiconductor substrate 300 having the first interlayer insulating layer 335 and the metal node plug 337. A first lower interconnection contact hole 341a may be formed through the second interlayer insulating layer 340 to expose the metal node plug 337, and a second lower interconnection contact hole 341b may be formed through the second and first interlayer insulating layers 340 and 335 to expose the lower source region 325s. Also, a third lower interconnection contact hole 341c may be formed through the second and first interlayer insulating layers 340 and 335 and the second and first lower interlayer insulating layers 316 and 313 to expose the bulk source region 312s, and a fourth lower interconnection contact hole 341d may be formed through the second and first interlayer insulating layers 340 and 335 and the second lower interlayer insulating layer 316 to expose both the second and first lower gate electrodes 330 and 315.

Further, a fifth lower interconnection contact hole 341e may be formed through the second and first interlayer insulating layers 340 and 335 and the second and first lower interlayer insulating layers 316 and 313 to expose the bulk gate electrode 307. The first through fifth lower interconnection contact holes 341a, 341b, 341c, 341d, and 341e may be filled with conductive layers, thereby forming first through fifth lower interconnection contact plugs 342a, 342b, 342c, 342d, and 342e, respectively.

As shown in FIG. 14C, top and bottom portions of the lower semiconductor body 325 disposed between the lower drain and source regions 325d and 325s are covered by the first and second lower gate electrodes 315 and 330. Accordingly, since the top and bottom portions of the lower semiconductor body 325 disposed between the lower drain and source regions 325d and 325s are affected by voltages at the first and second lower gate electrodes 315 and 330, they are hardly affected by the energy potential of the bulk gate electrode 307 as can be seen from reference character 'A5.'

Also, the first and second lower gate electrodes 315 and 330 occupy larger areas than the lower semiconductor body 325 so that sidewalls of the lower semiconductor body 325 are more affected by the voltages at the first and second lower gate electrodes 315 and 330. Accordingly, the influence of voltages at adjacent contacts can be reduced as can be seen from reference character 'B5.' Further, all the top and bottom portions of the lower semiconductor body 325 disposed between the lower drain and source regions 325d and 325s may be used as a channel region so that a channel width may increase. Therefore, a narrow width effect, which results from a reduction in the channel width due to high integration density, may be prevented.

Figure 15A:
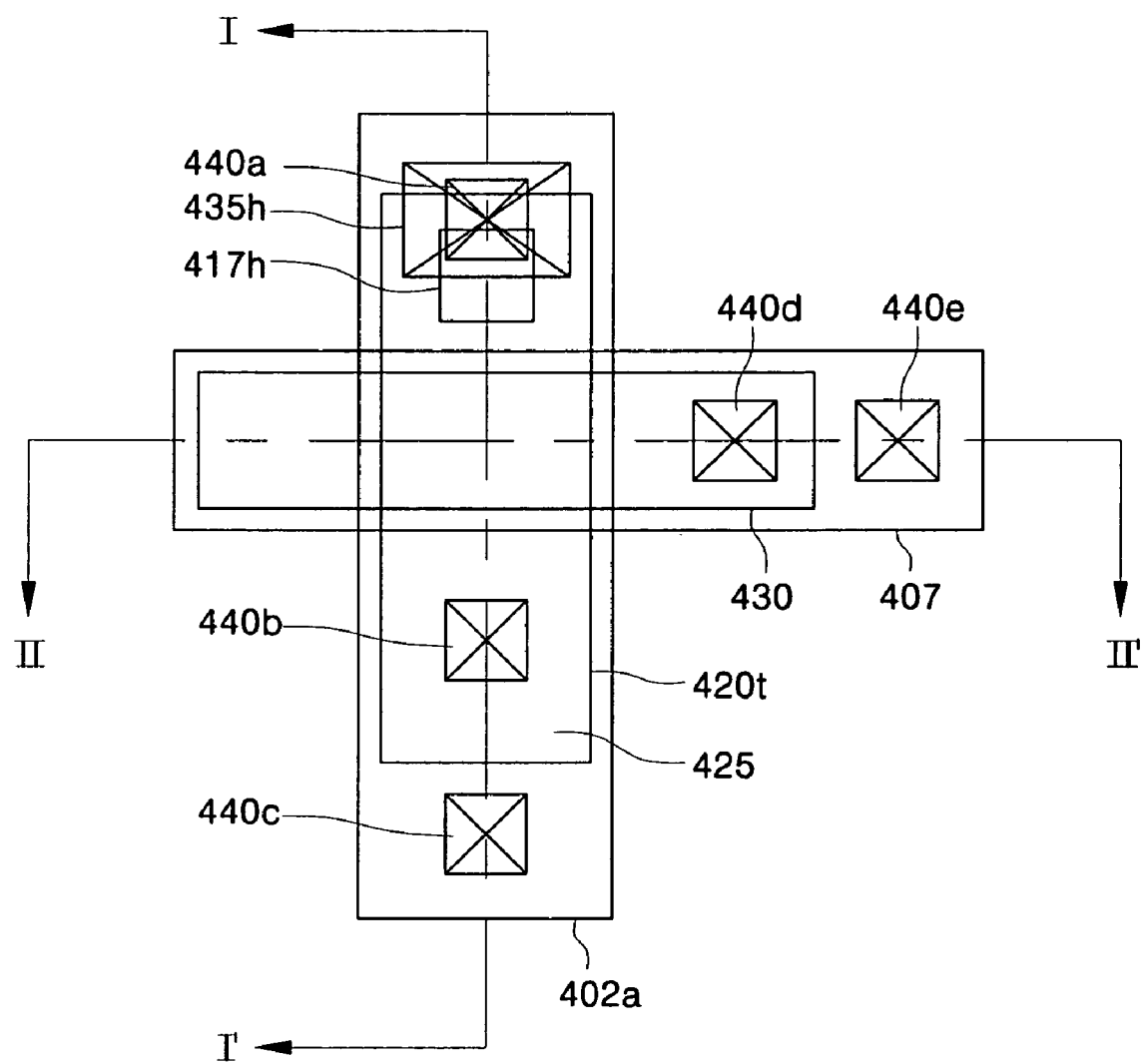
FIG. 15A is a plan view illustrating a method of fabricating a semiconductor device having a TFT according to still another exemplary embodiment of the present invention.
Figure 15B:
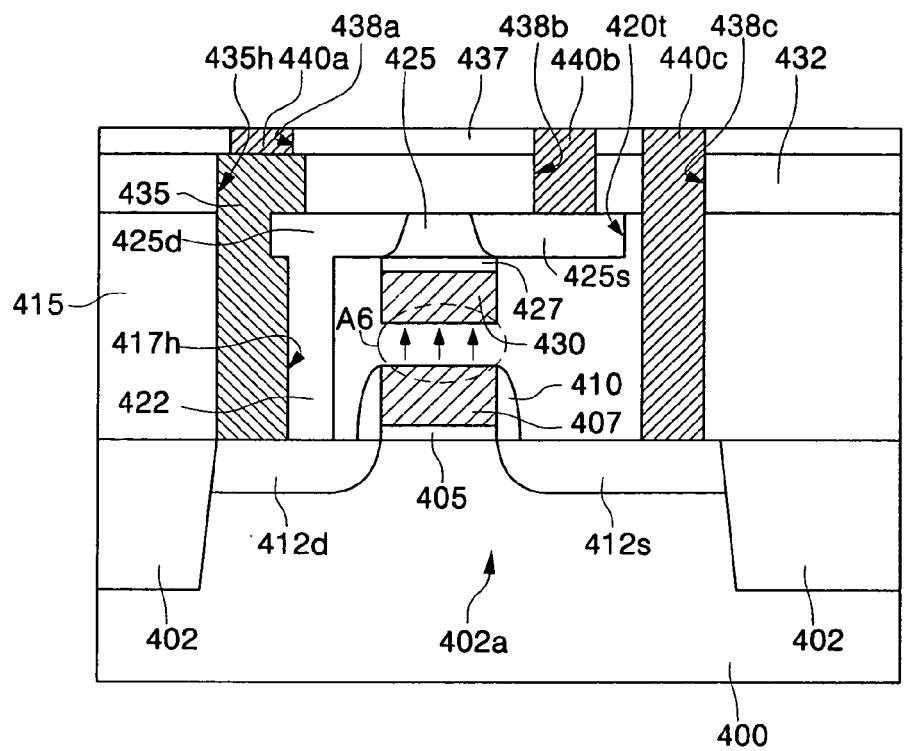
FIG. 15B is a cross-sectional view taken along line I-I' of FIG. 15A.
Figure 15C:
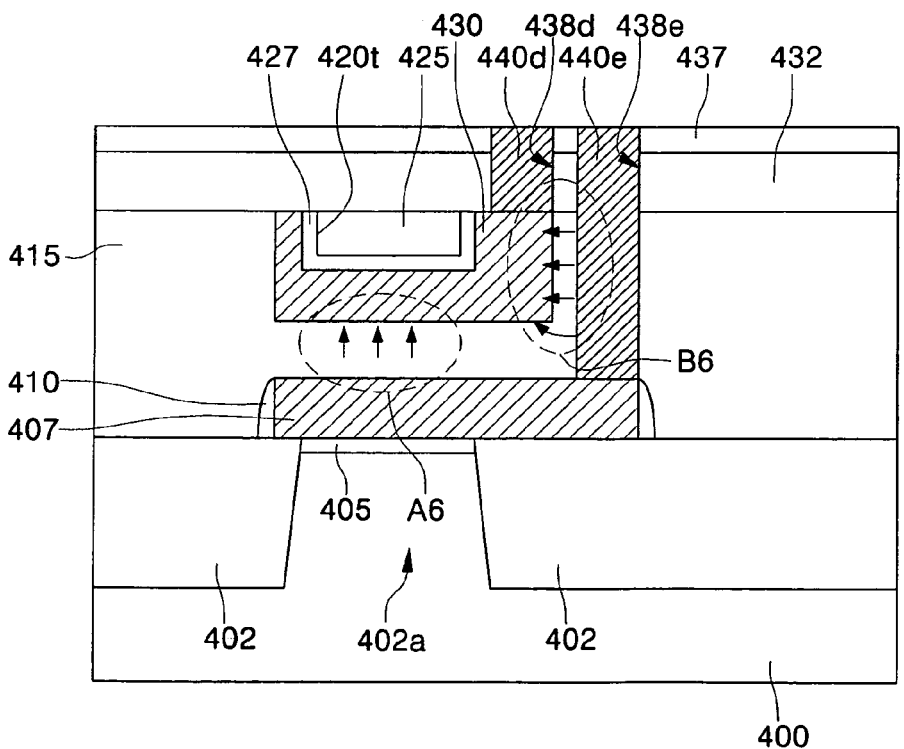
FIG. 15C is a cross-sectional view taken along line II-II' of FIG. 15A.

FIG. 15A is a plan view illustrating a method of fabricating a semiconductor device having a TFT according to still another exemplary embodiment of the present invention, FIG. 15B is a cross-sectional view taken along line I-I' of FIG. 15A, and FIG. 15C is a cross-sectional view taken along line II-II' of FIG. 15A.

Referring to FIGS. 15A, 15B and 15C, the method of fabricating the semiconductor device according to still another exemplary embodiment of the present invention are the same up to the step of forming the lower gate electrode 237 as described with reference to FIGS. 9A, 9B, 9C, 10A, 10B, 10C, 11A, 11B, and 11C. Specifically, an isolation layer 402 is formed in a predetermined region of a semiconductor substrate 400 to define an active region 402a. A bulk gate electrode 407 is formed across the active region 402a on the semiconductor substrate 400 having the active region 402a. Before the bulk gate electrode 407 is formed, a bulk gate insulating layer 405 may be formed between the bulk gate electrode 407 and the active region 402a. A bulk gate spacer 410 may be formed to cover sidewalls of the bulk gate electrode 407 and the bulk gate insulating layer 405 at the same time. Impurity ions are implanted into the semiconductor substrate 400 using the bulk gate electrode 407 and the bulk gate spacer 410 as ion implantation masks, thereby forming a bulk source region 412s and a bulk drain region 412d in the active region 402a. The bulk gate electrode 407, the bulk source region 412s, and the bulk drain region 412d constitute a bulk MOS transistor.

A planarized first lower interlayer insulating layer 415 is formed on the semiconductor substrate 400 having the bulk MOS transistor. The first lower interlayer insulating layer 415 may be patterned to form a lower node contact hole 417h that exposes the bulk drain region 412d. Thereafter, a trench 420t may be formed in the first lower interlayer insulating layer 415. The trench 420t may overlap the active region 402a such that it includes the lower node contact hole 417h. Alternatively, after the trench 420t is first formed, the lower node contact hole 417h may be formed.

A lower semiconductor node plug 422 may be formed in the lower node contact hole 417h by a SEG process using the bulk drain region 412d as a seed layer. Accordingly, when the semiconductor substrate 400 is a single crystalline semiconductor substrate, the lower semiconductor node plug 422 may also have a single crystalline structure. A lower semiconductor body 425 may be filled in the trench 420t by a SEG process using the lower semiconductor node plug 422 as a seed layer. Accordingly, when the lower semiconductor node plug 422 is a single crystalline semiconductor plug, the lower semiconductor body 425 may also have a single crystalline structure.

Thereafter, a preliminary lower gate electrode and a preliminary lower gate insulating layer are formed to cover top and bottom portions, and sidewalls of the lower semiconductor body 425 in the same forms as the lower gate electrode 237 and the lower gate insulating layer 235 of FIG. 11C, respectively. Impurity ions are implanted into the lower semiconductor body 425 using the preliminary lower gate electrode as an ion implantation mask, thereby forming a lower source region 425s and a lower drain region 425d. Then, the preliminary lower gate electrode and the preliminary lower gate insulating layer are planarized until a top surface of the lower semiconductor body 425 is exposed. Thus, a lower gate electrode 430 is formed to cover the bottom portion and sidewalls of the lower semiconductor body 425 and cross under the lower semiconductor body 425. Also, a lower gate insulating layer 427 is formed between the lower gate electrode 430 and the lower semiconductor body 425. The lower source region 425s, the lower drain region 425d, and the lower gate electrode 430 constitute a lower TFT. As can be seen from FIG. 15A, the lower TFT may overlap the bulk MOS transistor. That is, the lower semiconductor body 425 may overlap the active region 402a, and the lower gate electrode 430 may overlap the bulk gate electrode 407.

A first interlayer insulating layer 432 may be formed on the semiconductor substrate 400 having the lower gate electrode 430. When the lower semiconductor node plug 422 has the same conductivity type as the bulk drain region 412d, at least the lower drain region 425d may be exposed by a metal node contact hole 435h that is formed through the first interlayer insulating layer 432 and the lower interlayer insulating layer 415. Subsequently, a metal node plug 435 may be filled in the metal node contact hole 435h. As a result, the metal node plug 435 may be formed in contact with at least the lower drain region 425d.

When the lower semiconductor node plug 422 has a different conductivity type from the bulk drain region 412d, the metal node plug 435 may extend and come into contact with the bulk drain region 412d. Further, the metal node plug 435 may be in contact with not only the bulk and lower drain regions 412d and 425d but also the semiconductor node plug 422.

A second interlayer insulating layer 437 is formed on the semiconductor substrate 400 having the first interlayer insulating layer 432 and the metal node plug 435. A first lower interconnection contact hole 438a may be formed through the second interlayer insulating layer 437 to expose the metal node plug 435, and a second lower interconnection contact hole 438b may be formed through the second and first interlayer insulating layers 437 and 432 to expose the lower source region 425s. Also, a third lower interconnection contact hole 438c may be formed through the second, first, and lower interlayer insulating layers 437, 432, and 415 to expose the bulk source region 412s, and a fourth lower interconnection contact hole 438d may be formed through the second and first interlayer insulating layers 437 and 432 to expose the lower gate electrode 430.

Further, a fifth lower interconnection contact hole 438e may be formed through the second, first, and lower interlayer insulating layers 437, 432, and 415 to expose the bulk gate electrode 407. The first through fifth lower interconnection contact holes 438a, 438b, 438c, 438d, and 438e may be filled with conductive layers, thereby forming first through fifth lower interconnection contact plugs 440a, 440b, 440c, 440d, and 440e, respectively.

As shown in FIG. 15C, the sidewalls and bottom portion of the lower semiconductor body 425 disposed between the lower drain and source regions 425d and 425s are covered by the lower gate electrode 430. Accordingly, since the sidewalls and bottom portion of the lower semiconductor body 425 disposed between the lower drain and source regions 425d and 425s are affected by a voltage at the lower gate electrode 430, they are hardly affected by the energy potential of adjacent contacts and the bulk gate electrode 407 as can be seen from reference characters 'A6' and 'B6'. Also, all the sidewalls and bottom portion of the lower semiconductor body 425 disposed between the lower drain and source regions 425d and 425s may be used as a channel region, so that a channel width may increase. As a result, a narrow width effect, which results from a reduction in the channel width due to high integration density, may be prevented.

A semiconductor device having a TFT according to an exemplary embodiment of the present invention will be described with reference to FIGS. 8A, 8B and 8C.

FIG. 8A is a plan view of a semiconductor device having a TFT according to an exemplary embodiment of the present invention, FIG. 8B is a cross-sectional view taken along line I-I' of FIG. 8A, and FIG. 8C is a cross-sectional view taken along line II-II' of FIG. 8A.

Referring to FIGS. 8A, 8B and 8C, an isolation layer 102 is provided in a predetermined region of a semiconductor substrate 100 to define an active region 102a. A pair of first impurity regions, i.e., a bulk drain region 112d and a bulk source region 112s, are disposed in the active region 102a and spaced apart from each other. A bulk gate electrode 107 is disposed to cross over a channel region that is disposed between the bulk drain region 112d and the bulk source region 112s. The bulk gate electrode 107 is electrically insulated from the channel region by a bulk gate insulating layer 105. Sidewalls of the bulk gate electrode 107 may be covered with a bulk gate spacer 110. The bulk gate electrode 107, the bulk drain region 112d, and the bulk source region 112s constitute a bulk MOS transistor.

A first lower interlayer insulating layer 113 is disposed on the semiconductor substrate 100 having the bulk MOS transistor. A floating conductive layer pattern 114 may be disposed on the first lower interlayer insulating layer 113. The floating conductive layer pattern 114 may be formed of a heavily doped silicon layer or a metal layer. A second lower interlayer insulating layer 115 is disposed on the first lower interlayer insulating layer 113 having the floating conductive layer pattern 114. A trench 120t is disposed in the second lower interlayer insulating layer 115. The trench 120t may overlap the active region 102a. A lower semiconductor body 125 is filled in the trench 120t and protrudes upward.

A pair of second impurity regions, i.e., a lower drain region 125d and a lower source region 125s, are disposed in the lower semiconductor body 125 and spaced apart from each other. A lower gate electrode 130 is disposed to cover and cross a top portion and sidewalls of the lower semiconductor body 125 that is disposed between the lower drain and source regions 125d and 125s. The lower gate electrode 130 is electrically insulated from the lower semiconductor body 125 by a lower gate insulating layer 127. Sidewalls of the lower gate electrode 130 may be covered with a lower gate spacer 132. The lower gate electrode 130, the lower drain region 125d, and the lower source region 125s constitute a lower TFT. Also, the lower TFT may overlap the bulk MOS transistor as can be seen from FIG. 8A. That is, the lower semiconductor body 125 may overlap the active region 102a, and the lower gate electrode 130 may overlap the bulk gate electrode 107.

Furthermore, the bulk drain region 112d may be exposed by a lower node contact hole 117h that is formed through the first and second lower interlayer insulating layers 113 and 115, and the lower node contact hole 117h may be filled with a lower semiconductor node plug 122. The lower semiconductor node plug 122 may be in contact with a bottom surface of the lower semiconductor body 125. For example, the lower semiconductor node plug 122 may be in contact with the lower drain region 125d. The lower semiconductor node plug 122 may be formed by a SEG process using the bulk drain region 112d as a seed layer. Accordingly, when the semiconductor substrate 100 is a single crystalline semiconductor substrate, the lower semiconductor node plug 122 may also have a single crystalline structure. Also, the lower semiconductor body 125 may be epitaxially grown using the lower semiconductor node plug 122 as a seed layer. Accordingly, when the lower semiconductor node plug 122 is a single crystalline semiconductor plug, the lower semiconductor body 125 may also have a single crystalline structure.

An upper interlayer insulating layer 135 is disposed on the semiconductor substrate 100 having the lower TFT. An upper semiconductor body 150 is disposed on the upper interlayer insulating layer 135. A pair of third impurity regions, i.e., an upper drain region 150d and an upper source region 150s, are disposed in the upper semiconductor body 150 and spaced apart from each other. An upper gate electrode 155 is disposed to cover and cross a top portion and sidewalls of a channel region that is disposed between the upper drain and source regions 150d and 150s. The upper gate electrode 155 is electrically insulated from the channel region by a gate insulating layer 152. Sidewalls of the upper gate electrode 155 may be covered with an upper gate spacer 157. The upper gate electrode 155, the upper drain region 150d, and the upper source region 150s constitute an upper TFT. The upper TFT may overlap the lower TFT as can be seen from FIG. 8A. That is, the upper semiconductor body 150 may overlap the lower semiconductor body 125, and the upper gate electrode 155 may overlap the lower gate electrode 130.

Furthermore, the lower drain region 125d may be exposed by an upper node contact hole 142h that is formed through the upper interlayer insulating layer 135, and the upper node contact hole 142h may be filled with an upper semiconductor node plug 147. The upper semiconductor node plug 147 may be in contact with a bottom surface of the upper semiconductor body 150. For example, the upper semiconductor node plug 147 may be in contact with the upper drain region 150d. The upper semiconductor node plug 147 may be formed by a SEG process using the lower drain region 125d as a seed layer. Accordingly, when the lower semiconductor body 125 is a single crystalline semiconductor body, the upper semiconductor node plug 147 may also have a single crystalline structure. Also, the upper semiconductor body 150 may be epitaxially grown using the upper semiconductor node plug 147 as a seed layer. Accordingly, when the upper semiconductor node plug 147 is a single crystalline semiconductor plug, the upper semiconductor body 150 may also have a single crystalline structure.

A first interlayer insulating layer 160 is disposed on the semiconductor substrate 100 having the upper TFT. When the lower semiconductor node plug 122 has the same conductivity type as the bulk drain region 112d, at least the lower and upper drain regions 125d and 150d may be exposed by a metal node contact hole 162h that is formed through the first and second lower interlayer insulating layers 113 and 115, the upper interlayer insulating layer 135, and the first interlayer insulating layer 160, and the metal node contact hole 162h may be filled with a metal node plug 162. As a result, the metal node plug 162 is in contact with at least the lower and upper drain regions 125d and 150d. Meanwhile, when the lower semiconductor node plug 122 has a different conductivity type from the bulk drain region 112d, the metal node plug 162 may extend and come into contact with the bulk drain region 112d. The metal node plug 162 may be formed of a metal layer having an ohmic contact with both p-type and n-type semiconductors. For example, the metal node plug 162 may be formed of a tungsten plug.

A second interlayer insulating layer 165 is disposed on the semiconductor substrate 100 having the first interlayer insulating layer 160 and the metal node plug 162. The metal node plug 162 may be exposed by a first lower interconnection contact hole 166a that is formed through the second interlayer insulating layer 165, and the lower source region 125s may be exposed by a second lower interconnection contact hole 166b that is formed through the upper interlayer insulating layer 135, and the first and second interlayer insulating layers 160 and 165. Also, the bulk source region 112s may be exposed by a third lower interconnection contact hole 166c that is formed through the first and second lower interlayer insulating layers 113 and 115, the upper interlayer insulating layer 135, and the first and second interlayer insulating layers 160 and 165, and the lower gate electrode 130 may be exposed by a fourth lower interconnection contact hole 166d that is formed through the upper interlayer insulating layer 135, and the first and second interlayer insulating layers 160 and 165.

Further, the bulk gate electrode 107 may be exposed by a fifth lower interconnection contact hole 166e that is formed through the first and second lower interlayer insulating layers 113 and 115, the upper interlayer insulating layer 135, and the first and second interlayer insulating layers 160 and 165. The first through fifth lower interconnection contact holes 166a, 166b, 166c, 166d, and 166e may be filled with first through fifth lower interconnection contact plugs 167a, 167b, 167c, 167d, and 167e, respectively.

As shown in FIG. 8C, the top and sidewalls of the upper semiconductor body 150 of the upper TFT are covered with the upper gate electrode 155, and the top and sidewalls of the lower semiconductor body 125 are covered with the lower gate electrode 130. Thus, since the tops and sidewalls of the upper and lower semiconductor bodies 150 and 125 are affected by voltages at the upper and lower gate electrodes 155 and 130, respectively, they are hardly affected by the energy potential of adjacent contacts as can be seen from reference characters 'B2' and 'B3'.

Also, as can be seen from reference character 'A2,' even if a bottom surface of the upper semiconductor body 150 is exposed, the upper gate electrode 155 that covers the sidewalls of the upper semiconductor body 150 can reduce the influence of the voltage at the lower gate electrode 130 on the upper semiconductor body 150. Also, as can be seen from reference character 'A3,' the floating conductive layer pattern 114, which is formed between the bulk MOS transistor and the lower TFT, may protect a bottom surface of the lower semiconductor body 125 from the influence of the voltage at the bulk gate electrode 107. Further, an off voltage may be applied to the floating conductive layer pattern 114.

In addition, since all the top and sidewalls of the lower semiconductor body 125 disposed between the lower drain and source regions 125d and 125s may be used as a channel region, a channel width may increase. Similarly, all the top and sidewalls of the upper semiconductor body 150 disposed between the upper drain and source regions 150d and 150s are used as a channel region so that a channel width may increase. Therefore, a narrow width effect, which results from a reduction in the channel width due to high integration density, may be prevented.

A semiconductor device having a TFT according to another exemplary embodiment of the present invention will now be described with reference to FIGS. 12A, 12B and 12C.

FIG. 12A is a plan view of a semiconductor device having a TFT according to another exemplary embodiment of the present invention, FIG. 12B is a cross-sectional view taken along line I-I' of FIG. 12A, and FIG. 12C is a cross-sectional view taken along line II-II' of FIG. 12A.

Referring to FIGS. 12A, 12B and 12C, an isolation layer 202 is provided in a predetermined region of a semiconductor substrate 200 to define an active region 202a. A pair of first impurity regions, i.e., a bulk drain region 212d and a bulk source region 212s, are disposed in the active region 202a and spaced apart from each other. A bulk gate electrode 207 is disposed to cross over a channel region that is disposed between the bulk drain region 212d and the bulk source region 212s. The bulk gate electrode 207 is electrically insulated from the channel region by a bulk gate insulating layer 205. Sidewalls of the bulk gate electrode 207 may be covered with a bulk gate spacer 210. The bulk gate electrode 207, the bulk drain region 212d, and the bulk source region 212s constitute a bulk MOS transistor. A lower interlayer insulating layer 215 is disposed on the semiconductor substrate 200 having the bulk MOS transistor. A trench 220t is disposed in the lower interlayer insulating layer 215. The trench 220t may overlap the active region 202a. A lower semiconductor body 225 is filled in the trench 220t.

A pair of second impurity regions, i.e., a lower drain region 225d and a lower source region 225s, are disposed in the lower semiconductor body 225 and spaced apart from each other. A lower gate electrode 237 is disposed to cover and cross a top portion, sidewalls, and a bottom portion of the lower semiconductor body 225 that is disposed between the lower drain and source regions 225d and 225s. The lower gate electrode 237 is electrically insulated from the lower semiconductor body 225 by a lower gate insulating layer 235. Sidewalls of the lower gate electrode 237 may be covered with a lower gate spacer 240. The lower gate electrode 237, the lower drain region 225d, and the lower source region 225s constitute a lower TFT. Also, the lower TFT may overlap the bulk MOS transistor as can be seen from FIG. 12A. That is, the lower semiconductor body 225 may overlap the active region 202a, and the lower gate electrode 237 may overlap the bulk gate electrode 207.

Furthermore, the bulk drain region 212d may be exposed by a lower node contact hole 217h that is formed through the lower interlayer insulating layer 215, and the lower node contact hole 217h may be filled with a lower semiconductor node plug 222. The lower semiconductor node plug 222 may be in contact with a bottom surface of the lower semiconductor body 225. For example, the lower semiconductor node plug 222 may be in contact with the lower drain region 225d. The lower semiconductor node plug 222 may be formed by a SEG process using the bulk drain region 212d as a seed layer. Accordingly, when the semiconductor substrate 200 is a single crystalline semiconductor substrate, the lower semiconductor node plug 222 may also have a single crystalline structure. Also, the lower semiconductor body 225 may be epitaxially grown using the lower semiconductor node plug 222 as a seed layer. Accordingly, when the lower semiconductor node plug 222 is a single crystalline semiconductor plug, the lower semiconductor body 225 may also have a single crystalline structure.

A first interlayer insulating layer 242 is disposed on the semiconductor substrate 200 having the lower TFT. When the lower semiconductor node plug 222 has the same conductivity type as the bulk drain region 212d, at least the lower drain region 225d may be exposed by a metal node contact hole 245h that is formed through the lower interlayer insulating layer 215 and the first interlayer insulating layer 242, and the metal node contact hole 245h may be filled with a metal node plug 245. As a result, the metal node plug 245 is in contact with at least the lower drain region 225d. Meanwhile, when the lower semiconductor node plug 222 has a different conductivity type from the bulk drain region 212d, the metal node plug 245 may extend and come into contact with the bulk drain region 212d.

A second interlayer insulating layer 246 is disposed on the semiconductor substrate 200 having the first interlayer insulating layer 242 and the metal node plug 245. The metal node plug 245 may be exposed by a first lower interconnection contact hole 247a that is formed through the second interlayer insulating layer 246, and the lower source region 225s may be exposed by a second lower interconnection contact hole 247b that is formed through the first and second interlayer insulating layers 242 and 246. Also, the bulk source region 212s may be exposed by a third lower interconnection contact hole 247c that is formed through the lower interlayer insulating layer 215, and the first and second interlayer insulating layers 242 and 246, and the lower gate electrode 237 may be exposed by a fourth lower interconnection contact hole 247d that is formed through the first and second interlayer insulating layers 242 and 246. Further, the bulk gate electrode 207 may be exposed by a fifth lower interconnection contact hole 247e that is formed through the lower interlayer insulating layer 215, and the first and second interlayer insulating layers 242 and 246. The first through fifth lower interconnection contact holes 247a, 247b, 247c, 247d, and 247e may be filled with first through fifth lower interconnection contact plugs 250a, 250b, 250c, 250d, and 250e, respectively.

As shown in FIG. 12C, the top portion, sidewalls, and bottom portion of the lower semiconductor body 225 disposed between the lower drain and source regions 225d and 225s are covered with the lower gate electrode 237. Accordingly, since all the surfaces of the lower semiconductor body 225 disposed between the lower drain and source regions 225d and 225s are affected by a voltage at the lower gate electrode 237, they are hardly affected by the energy potential of adjacent contacts and the bulk gate electrode 207 as can be seen from reference characters 'A4' and 'B4.' Also, all the top and bottom portions and sidewalls of the lower semiconductor body 225 disposed between the lower drain and source regions 225d and 225s may be used as a channel region, so that a channel width may increase. As a result, a narrow width effect, which results from a reduction in the channel width due to high integration density, may be prevented.

A semiconductor device having a TFT according to yet another exemplary embodiment of the present invention will now be described with reference to FIGS. 14A, 14B and 14C.

FIG. 14A is a plan view of a semiconductor device having a TFT according to yet another exemplary embodiment of the present invention, FIG. 14B is a cross-sectional view taken along line I-I' of FIG. 14A, and FIG. 14C is a cross-sectional view taken along line II-II' of FIG. 14A.

Referring to FIGS. 14A, 14B and 14C, an isolation layer 302 is provided in a predetermined region of a semiconductor substrate 300 to define an active region 302a. A pair of first impurity regions, i.e., a bulk drain region 312d and a bulk source region 312s, are disposed in the active region 302a and spaced apart from each other. A bulk gate electrode 307 is disposed to cross over a channel region that is disposed between the bulk drain region 312d and the bulk source region 312s. The bulk gate electrode 307 is electrically insulated from the channel region by a bulk gate insulating layer 305. Sidewalls of the bulk gate electrode 307 may be covered with a bulk gate spacer 310. The bulk gate electrode 307, the bulk drain region 312d, and the bulk source region 312s constitute a bulk MOS transistor.

A first lower interlayer insulating layer 313 is disposed on the semiconductor substrate 300 having the bulk MOS transistor. A first lower gate electrode 315 is disposed on the first lower interlayer insulating layer 313. The first lower gate electrode 315 may overlap the bulk gate electrode 307. A second lower interlayer insulating layer 316 is disposed on the first lower interlayer insulating layer 313 having the first lower gate electrode 315. A trench 317t is disposed in the second lower interlayer insulating layer 316 to expose a top surface of the first lower gate electrode 315. The trench 317t may overlap the active region 302a. A first lower gate insulating layer 318 may be conformally disposed in the trench 317t. A lower semiconductor body 325 is disposed on the first lower gate insulating layer 318 to fill the trench 317t.

A pair of second impurity regions, i.e., a lower drain region 325d and a lower source region 325s, are disposed in the lower semiconductor body 325 and spaced apart from each other. A second lower gate electrode 330 is disposed to cross over the lower semiconductor body 325 that is disposed between the lower drain and source regions 325d and 325s. The second lower gate electrode 330 is electrically insulated from the lower semiconductor body 325 by a second lower gate insulating layer 327. Sidewalls of the second lower gate electrode 330 may be covered with a lower gate spacer 332. The first and second lower gate electrodes 315 and 330, the lower drain region 325d, and the lower source region 325s constitute a lower TFT. Also, the lower TFT may overlap the bulk MOS transistor as can be seen from FIG. 14A. That is, the lower semiconductor body 325 may overlap the active region 302a, and the first and second lower gate electrodes 315 and 330 may overlap the bulk gate electrode 307.

Furthermore, the bulk drain region 312d may be exposed by a lower node contact hole 320h that is formed through the first and second lower interlayer insulating layers 313 and 316, and the lower node contact hole 320h may be filled with a lower semiconductor node plug 322. The lower semiconductor node plug 322 may be in contact with a bottom surface of the lower semiconductor body 325. For example, the lower semiconductor node plug 322 may be in contact with the lower drain region 325d. The lower semiconductor node plug 322 may be formed by a SEG process using the bulk drain region 312d as a seed layer. Accordingly, when the semiconductor substrate 300 is a single crystalline semiconductor substrate, the lower semiconductor node plug 322 may also have a single crystalline structure. Also, the lower semiconductor body 325 may be epitaxially grown using the lower semiconductor node plug 322 as a seed layer. Accordingly, when the lower semiconductor node plug 322 is a single crystalline semiconductor plug, the lower semiconductor body 325 may also have a single crystalline structure.

A first interlayer insulating layer 335 is disposed on the semiconductor substrate 300 having the lower TFT. When the lower semiconductor node plug 322 has the same conductivity type as the bulk drain region 312d, at least the lower drain region 325d may be exposed by a metal node contact hole 337h that is formed through the first and second lower interlayer insulating layers 313 and 316, and the first interlayer insulating layer 335, and the metal node contact hole 337h may be filled with a metal node plug 337. As a result, the metal node plug 337 is in contact with at least the lower drain region 325d. Meanwhile, when the lower semiconductor node plug 322 has a different conductivity type from the bulk drain region 312d, the metal node plug 337 may extend and come into contact with the bulk drain region 312d.

A second interlayer insulating layer 340 is disposed on the semiconductor substrate 300 having the first interlayer insulating layer 335 and the metal node plug 337. The metal node plug 337 may be exposed by a first lower interconnection contact hole 341a that is formed through the second interlayer insulating layer 340, and the lower source region 325s may be exposed by a second lower interconnection contact hole 341b that is formed through the first and second interlayer insulating layers 335 and 340. Also, the bulk source region 312s may be exposed by a third lower interconnection contact hole 341c that is formed through the first and second lower interlayer insulating layers 313 and 316, and the first and second interlayer insulating layers 335 and 340, and the first and second lower gate electrodes 315 and 330 may be exposed by a fourth lower interconnection contact hole 341d that is formed through the first and second interlayer insulating layers 335 and 340.

Further, the bulk gate electrode 307 may be exposed by a fifth lower interconnection contact hole 341e that is formed through the first and second lower interlayer insulating layers 313 and 316, and the first and second interlayer insulating layers 335 and 340. The first through fifth lower interconnection contact holes 341a, 341b, 341c, 341d, and 341e may be filled with first through fifth lower interconnection contact plugs 342a, 342b, 342c, 342d, and 342e, respectively.

As shown in FIG. 14C, top and bottom portions of the lower semiconductor body 325 disposed between the lower drain and source regions 325d and 325s are covered with the first and second lower gate electrodes 315 and 330. Accordingly, since the top and bottom portions of the lower semiconductor body 325 disposed between the lower drain and source regions 325d and 325s are affected by voltages at the first and second lower gate electrodes 315 and 330, they are hardly affected by the energy potential of the bulk gate electrode 307 as can be seen from reference character 'A5.'

Also, the first and second lower gate electrodes 315 and 330 occupy larger areas than the lower semiconductor body 325 so that sidewalls of the lower semiconductor body 325 are more affected by the voltages at the first and second lower gate electrodes 315 and 330. Accordingly, the influence of voltages at adjacent contacts may be reduced as seen from reference character 'B5.' Further, all the top and bottom portions of the lower semiconductor body 325 disposed between the lower drain and source regions 325d and 325s may be used as a channel region so that a channel width may increase. Therefore, a narrow width effect, which results from a reduction in the channel width due to high integration density, may be prevented.

A semiconductor device having a TFT according to still another exemplary embodiment of the present invention will now be described with reference to FIGS. 15A, 15B 15C.

FIG. 15A is a plan view of a semiconductor device having a TFT according to still another exemplary embodiment of the present invention, FIG. 15B is a cross-sectional view taken along line I-I' of FIG. 15A, and FIG. 15C is a cross-sectional view taken along line II-II' of FIG. 15A.

Referring to FIGS. 15A, 15B and 15C, an isolation layer 402 is provided in a predetermined region of a semiconductor substrate 400 to define an active region 402a. A pair of first impurity regions, i.e., a bulk drain region 412d and a bulk source region 412s, are disposed in the active region 402a and spaced apart from each other. A bulk gate electrode 407 is disposed to cross over a channel region that is disposed between the bulk drain region 412d and the bulk source region 412s. The bulk gate electrode 407 is electrically insulated from the channel region by a bulk gate insulating layer 405. Sidewalls of the bulk gate electrode 407 may be covered with a bulk gate spacer 410. The bulk gate electrode 407, the bulk drain region 412d, and the bulk source region 412s constitute a bulk MOS transistor. A lower interlayer insulating layer 415 is disposed on the semiconductor substrate 400 having the bulk MOS transistor. A trench 420t is disposed in the lower interlayer insulating layer 415. The trench 420t may overlap the active region 402a. A lower semiconductor body 425 is filled in the trench 420t.

A pair of second impurity regions, i.e., a lower drain region 425d and a lower source region 425s, are disposed in the lower semiconductor body 425 and spaced apart from each other. A lower gate electrode 430 is disposed to cover and cross sidewalls and a bottom portion of the lower semiconductor body 425 that is disposed between the lower drain and source regions 425*d* and 425*s*. The lower gate electrode 430 is electrically insulated from the lower semiconductor body 425 by a lower gate insulating layer 427. The lower gate electrode 430, the lower drain region 425*d*, and the lower source region 425*s* constitute a lower TFT. Also, the lower TFT may overlap the bulk MOS transistor as can be seen from FIG. 15A. That is, the lower semiconductor body 425 may overlap the active region 402*a*, and the lower gate electrode 430 may overlap the bulk gate electrode 407.

Furthermore, the bulk drain region 412*d* may be exposed by a lower node contact hole 417*h* that is formed through the lower interlayer insulating layer 415, and the lower node contact hole 417*h* may be filled with a lower semiconductor node plug 422. The lower semiconductor node plug 422 may be in contact with a bottom surface of the lower semiconductor body 425. For example, the lower semiconductor node plug 422 may be in contact with the lower drain region 425*d*. The lower semiconductor node plug 422 may be formed by a SEG process using the bulk drain region 412*d* as a seed layer. Accordingly, when the semiconductor substrate 400 is a single crystalline semiconductor substrate, the lower semiconductor node plug 422 may also have a single crystalline structure. Also, the lower semiconductor body 425 may be epitaxially grown using the lower semiconductor node plug 422 as a seed layer. Accordingly, when the lower semiconductor node plug 422 is a single crystalline semiconductor plug, the lower semiconductor body 425 may also have a single crystalline structure.

A first interlayer insulating layer 432 is disposed on the semiconductor substrate 400 having the lower TFT. When the lower semiconductor node plug 422 has the same conductivity type as the bulk drain region 412*d*, at least the lower drain region 425*d* may be exposed by a metal node contact hole 435*h* that is formed through the lower interlayer insulating layer 415 and the first interlayer insulating layer 432, and the metal node contact hole 435*h* may be filled with a metal node plug 435. As a result, the metal node plug 435 is in contact with at least the lower drain region 425*d*. Meanwhile, when the lower semiconductor node plug 422 has a different conductivity type from the bulk drain region 412*d*, the metal node plug 435 may extend and come into contact with the bulk drain region 412*d*.

A second interlayer insulating layer 437 is disposed on the semiconductor substrate 400 having the first interlayer insulating layer 432 and the metal node plug 435. The metal node plug 435 may be exposed by a first lower interconnection contact hole 438*a* that is formed through the second interlayer insulating layer 437, and the lower source region 425*s* may be exposed by a second lower interconnection contact hole 438*b* that is formed through the first and second interlayer insulating layers 432 and 437. Also, the bulk source region 412*s* may be exposed by a third lower interconnection contact hole 438*c* that is formed through the lower interlayer insulating layer 415, and the first and second interlayer insulating layers 432 and 437, and the lower gate electrode 430 may be exposed by a fourth lower interconnection contact hole 438*d* that is formed through the first and second interlayer insulating layers 432 and 437.

Further, the bulk gate electrode 407 may be exposed by a fifth lower interconnection contact hole 438*e* that is formed through the lower interlayer insulating layer 415, and the first and second interlayer insulating layers 432 and 437. The first through fifth lower interconnection contact holes 438*a*, 438*b*, 438*c*, 438*d*, and 438*e* may be filled with first through fifth lower interconnection contact plugs 440*a*, 440*b*, 440*c*, 440*d*, and 440*e*, respectively.

As shown in FIG. 15C, the sidewalls and bottom portion of the lower semiconductor body 425 disposed between the lower drain and source regions 425*d* and 425*s* are covered with the lower gate electrode 430. Accordingly, since the sidewalls and bottom portion of the lower semiconductor body 425 disposed between the lower drain and source regions 425*d* and 425*s* are affected by a voltage at the lower gate electrode 430, they are hardly affected by the energy potential of adjacent contacts and the bulk gate electrode 407 as can be seen from reference characters 'A6' and 'B6'. Also, all the sidewalls and bottom portion of the lower semiconductor body 425 disposed between the lower drain and source regions 425*d* and 425*s* may be used as a channel region, so that a channel width may increase. As a result, a narrow width effect, which results from a reduction in the channel width due to high integration density, may be prevented.

According to the present invention as described above, a semiconductor device includes a TFT having a gate electrode that covers and crosses at least portions of at least two surfaces of a semiconductor body disposed between a drain region and a source region. Thus, since the at least two surfaces of the semiconductor body are affected by a voltage at the gate electrode, the influence of the energy potential of adjacent contacts and another gate electrode may be minimized or prevented. Also, the at least two surfaces of the semiconductor body disposed between the drain and source regions are used as a channel region so that a channel width may increase. As a result, a narrow width effect, which results from a reduction in the channel width due to high integration density, may be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:

a semiconductor substrate;

a lower MOS transistor having a lower gate electrode on the semiconductor substrate;

a first interlayer insulating layer disposed on the semiconductor substrate having the lower MOS transistor;

a semiconductor body disposed on or in the interlayer insulating layer;

a thin film transistor including a source region and a drain region, which are disposed in the semiconductor body, and first and second gate electrodes, wherein the first gate electrode is positioned underneath a bottom portion of the lower semiconductor body disposed between the source and drain regions and the second electrode covers a top portion of the semiconductor body disposed between the source and drain regions, wherein the first and second gate electrodes are spaced apart from each other;

a second interlayer insulating layer on the semiconductor substrate having the thin film transistor; and a contact plug penetrating the second interlayer insulating layer and being electrically connected to the first and the second gate electrodes.

2. A method of fabricating a semiconductor device, comprising:
forming a first lower interlayer insulating layer on a semiconductor substrate;
forming a lower semiconductor body on or in the first lower interlayer insulating layer; and
forming a lower thin film transistor including a lower source region and a lower drain region, and a lower gate electrode, wherein the lower source and drain regions are formed in the lower semiconductor body, and the lower gate electrode is formed to cover a top portion and at least a side portion of sidewalls of the lower semiconductor body disposed between the lower source and drain regions, wherein a top surface of the lower semiconductor body extends along an axis, and wherein the lower gate electrode intersects the axis to cover the at least the side portion of sidewalls of the lower semiconductor body below the axis, wherein forming the lower semiconductor body and the lower thin film transistor comprises:
forming a trench in the first lower interlayer insulating layer;
forming a lower semiconductor body in the trench;
forming a second lower interlayer insulating layer on the semiconductor substrate having the lower semiconductor body;
sequentially etching portions of the second lower interlayer insulating layer and the first lower interlayer insulating layer to expose a top portion, sidewalls, and a bottom portion of a predetermined region of the lower semiconductor body;
forming a lower gate electrode to be positioned underneath a bottom portion of the lower semiconductor body and cover the exposed top portion and sidewalls of the lower semiconductor body and to cross the lower semiconductor body; and
implanting impurity ions into the lower semiconductor body using the lower gate electrode as an ion implantation mask to form lower source and drain regions.

3. The method according to claim 2, further comprising forming a gate insulating layer between the lower semiconductor body and the lower gate electrode.

4. The method according to claim 2, wherein the lower semiconductor body is formed of a single crystalline semiconductor material.

5. The method according to claim 2, further comprising forming a bulk MOS transistor including a bulk source region and a bulk drain region, and a bulk gate electrode,
wherein the bulk source and drain regions are disposed in the semiconductor substrate between the semiconductor substrate and the first lower interlayer insulating layer, and the bulk gate electrode is disposed to cross over a channel region disposed between the bulk source and drain regions.

6. The method according to claim 2, further comprising:
forming an upper interlayer insulating layer on the semiconductor substrate having the lower thin film transistor;
forming an upper semiconductor body on or in the upper interlayer insulating layer; and
forming an upper thin film transistor including an upper source region and an upper drain region, and an upper gate electrode,
wherein the upper source and drain regions are formed in the upper semiconductor body, and the upper gate electrode is formed across the upper semiconductor body between the upper source and drain regions.

7. The method according to claim 5, wherein the lower thin film transistor at least partially overlaps the bulk MOS transistor.

8. The method according to claim 7, further comprising forming a floating conductive layer pattern in the first lower interlayer insulating layer between the bulk MOS transistor and the lower thin film transistor in a horizontal direction.

9. The method according to claim 8, wherein an off voltage is applied to the floating conductive layer pattern.

10. The method according to claim 6, wherein the upper gate electrode is formed to cover and cross at least portions of at least two surfaces of the upper semiconductor body disposed between the upper source and drain regions.

11. The method according to claim 6, wherein the upper semiconductor body is formed of a single crystalline semiconductor material.

12. The method according to claim 6, wherein the upper thin film transistor at least partially overlaps the lower thin film transistor.

13. The method according to claim 12, further comprising forming a floating conductive layer pattern under the upper thin film transistor.

14. A method of fabricating a semiconductor device, comprising:
forming a bulk MOS transistor on a semiconductor substrate;
forming an interlayer insulating layer on the semiconductor substrate having the bulk MOS transistor;
forming a semiconductor body on or in the interlayer insulating layer; and
forming a thin film transistor including a source region and a drain region, and a gate electrode, wherein the source and drain regions are formed in the semiconductor body, and the gate electrode is positioned underneath a bottom portion of the semiconductor body and covers a top portion of the semiconductor body disposed between the source and drain regions, wherein forming the semiconductor body and the thin film transistor comprises:
forming a first gate electrode on the interlayer insulating layer;
forming a second interlayer insulating layer to cover the first gate electrode;
forming a trench in the second interlayer insulating layer to expose a top surface of the first gate electrode, the trench occupying a larger area;
forming a semiconductor body in the trench;
forming a second gate electrode crossing the semiconductor body on the semiconductor substrate having the semiconductor body, the first and second gate electrodes constituting the gate electrode; and
implanting impurity ions into the semiconductor body using the second gate electrode as an ion implantation mask to form source and drain regions.

15. A method of fabricating a semiconductor device, comprising:
forming a first interlayer insulating layer on a semiconductor substrate;
forming a semiconductor body on or in the first interlayer insulating layer;
forming a second interlayer insulating layer on the semiconductor substrate having the semiconductor body;
sequentially etching portions of the second interlayer insulating layer and the first interlayer insulating layer to expose a top portion, sidewalls, and a bottom portion of a predetermined region of the semiconductor body;
forming a preliminary gate electrode to be positioned underneath a bottom portion of the semiconductor body and cover the exposed top portion and sidewalls of the semiconductor body and to cross the semiconductor body;

implanting impurity ions into the semiconductor body using the preliminary gate electrode as an ion implantation mask to form lower source and drain regions; and planarizing the preliminary gate electrode to expose the top portion of the semiconductor body, thereby forming a gate electrode to be positioned underneath a bottom portion of the semiconductor body and cover a side portion of a sidewall of the semiconductor body.

* * * * *